(12) United States Patent
Do et al.

(10) Patent No.: US 10,236,324 B1
(45) Date of Patent: Mar. 19, 2019

(54) FULL-COLOR LIGHT EMITTING DIODE DISPLAY HAVING IMPROVED LUMINANCE AND METHOD OF MANUFACTURING THE SAME

(71) Applicant: SAMSUNG DISPLAY CO., LTD., Yongin-si, Gyeonggi-do (KR)

(72) Inventors: Young Rag Do, Seoul (KR); Yun Jae Eo, Seoul (KR); Yeon Goog Sung, Goyang (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/705,293

(22) Filed: Sep. 15, 2017

(51) Int. Cl.
| | |
|---|---|
| H01L 27/32 | (2006.01) |
| H01L 33/38 | (2010.01) |
| H01L 27/15 | (2006.01) |
| H01L 33/50 | (2010.01) |
| G09G 3/32 | (2016.01) |
| H01L 33/44 | (2010.01) |

(52) U.S. Cl.
CPC ........... *H01L 27/3213* (2013.01); *G09G 3/32* (2013.01); *H01L 27/15* (2013.01); *H01L 33/38* (2013.01); *H01L 33/504* (2013.01); *H01L 33/508* (2013.01); *G09G 2300/0452* (2013.01); *G09G 2310/0264* (2013.01); *H01L 33/44* (2013.01)

(58) Field of Classification Search
CPC ......... H01L 33/38; H01L 33/44; H01L 33/50; H01L 33/508; H01L 27/15; H01L 27/153; H01L 27/3213; G09G 3/30; G09G 3/32; G09G 2300/0439; G09G 2300/0452; G09G 2300/0456; G09G 2300/0465
See application file for complete search history.

(56) References Cited

U.S. PATENT DOCUMENTS

2008/0258160 A1* 10/2008 Do ................. H01L 33/508
257/98

FOREIGN PATENT DOCUMENTS

| KR | 20090121743 A | 11/2009 |
|---|---|---|
| KR | 20120122645 A | 11/2012 |
| KR | 101436123 B1 | 11/2014 |
| KR | 20150006798 A | 1/2015 |
| KR | 101627365 B1 | 6/2016 |

\* cited by examiner

*Primary Examiner* — Thanhha Pham
(74) *Attorney, Agent, or Firm* — Lewis Roca Rothgerber Christie LLP

(57) ABSTRACT

A full-color light emitting diode (LED) display having an improved luminance is provided herein. More specifically, provided herein are a full-color LED display, in which an amount of light blocked by electrodes and not extracted is minimized and ultra-small LED devices are connected to ultra-small electrodes without defects such as electrical short circuits and the like, wherein the full-color LED display exhibits a further improved luminance when a direct current (DC) driving voltage is used and each pixel of the full-color LED display exhibits uniform luminance when the DC driving voltage is used, and a method of manufacturing the same.

9 Claims, 26 Drawing Sheets

FULL-COLOR LIGHT EMITTING DIODE DISPLAY HAVING IMPROVED LUMINANCE AND METHOD OF MANUFACTURING THE SAME

BACKGROUND

Field of the Invention

The present invention relates to a full-color light emitting diode (LED) display, and more particularly, a full-color LED display in which an amount of light blocked by electrodes and not extracted is minimized and ultra-small LED devices are connected to ultra-small electrodes without defects such as electrical short circuits and the like, wherein the full-color LED display exhibits a much improved luminance when a direct current (DC) driving voltage is used, and each pixel of the full-color LED display exhibits uniform luminance when the DC driving voltage is used, and a method of manufacturing the same.

Discussion of Related Art

Light emitting diode (LED) devices have been actively developed since Nakamura of Nichia Co. in Japan succeeded in fusing a high-quality single crystalline GaN nitride semiconductor in 1992 by applying a low-temperature GaN compound buffer layer thereto. An LED is a semiconductor having a structure, in which an N-type semiconductor crystal having electrons as a plurality of carriers and a P-type semiconductor crystal having holes as a plurality of carriers are joined to each other using characteristics of a compound semiconductor, and is a semiconductor device which converts electric signals into light having a desired wavelength band to display the light. In relation to such an LED, Korean Patent Laid-Open Publication No. 10-2009-0121743 discloses a method of manufacturing an LED and an LED manufactured thereby.

The LED is a green component which has a very low energy consumption due to high light conversion efficiency thereof, has a semi-permanent lifetime, and is eco-friendly. LEDs are being applied in many fields, such as traffic lights, mobile phones, vehicle headlights, outdoor display boards, liquid crystal display backlight units (LCD BLUs), indoor and outdoor lighting, etc., and are being actively research domestically and internationally.

One of the fields where LEDs are recently being widely used is a display field. Currently, an LED is a light source provided in a BLU of an LCD device, which is one of light receiving type displays, and is being widely used only in the display field. A full-color LED display capable of directly displaying an image through LEDs is not commercially available. Since there are technical limitations in a process of mounting and arranging LEDs in a panel, it is not easy to commercialize full-color LED displays. Specifically, in order to realize high-resolution image quality, a number of pixels are needed, and a plurality of subpixels which implement different colors have to be included in a unit pixel. In order for a plurality of pixels to be mounted within a limited unit area, the size of the unit pixel has to be reduced, and the size of the subpixel also has to be reduced. At this time, a size of an LED included in each subpixel has to also be reduced, and when a plurality of LEDs are provided in a single subpixel, the size of the LED has to be further reduced. However, it is not easy to mount miniaturized LEDs at desired positions on an electrode line. Particularly, a process of mounting ultra-small LEDs that cannot be picked up by people or machines is very difficult. Therefore, it is not possible to arrange LED devices, which are individually grown and have individually sizes in the unit of micro or nanometer, on a display electrode line, and thus commercialization of the full-color LED display has continuously been delayed.

In order to solve the above problems, the inventor of the present invention proposed a disclosure, Korean Patent Registration No. 1209449, in which a coupling linker is attached to one end of an ultra-small LED device and another coupling linker capable of coupling with the coupling linker is attached to an electrode, on which the ultra-small LED device is mounted, to realize a full-color LED display. However, mounting actual miniature LED devices on an electrode with only coupling linkers is difficult, and particularly, mounting of ultra-small LED devices upright between electrode lines vertically disposed is very difficult. Even when an LED display is manufactured, the number of LED devices interposed to be upright between electrodes vertically disposed is significantly low, and thus only an LED display having very low luminance is manufactured.

Accordingly, the present inventor proposed a disclosure, Korean Patent Registration No. 1436123, for implementing an LED display manufactured by implementing ultra-small LED devices in the unit of nanometer as electrode assemblies by applying power to an ultra-small electrode line. However, in a display including ultra-small LED electrode assemblies realized through such a technique, the number of ultra-small LED devices which did not emit light when a direct current (DC) was applied thereto as driving power was remarkably increased, and thus it was difficult to obtain a desired luminance and power selection had limitations, that is, alternating current (AC) power had to be applied to the LED electrode assemblies as the driving power. This result was due to a characteristic of an LED serving as a rectifier. A direction of a current in a device can be determined according to a semiconductor layer structure in the device. For example, in the case of an LED in which a P-type semiconductor and an N-type semiconductor are joined, when positive (+) power is supplied to the P-type semiconductor and negative (−) power is supplied to the N-type semiconductor, a current can flow through the LED due to a potential difference generated by free electrons of the N-type semiconductor moving toward holes of the P-type semiconductor, and a diode can emit light by recombining the free electrons and the holes. However, when negative (−) power is supplied to the P-type semiconductor and positive (+) power is supplied to the N-type semiconductor, the diode cannot emit light because a current does not flow therein. Therefore, a display including ultra-small LED electrode assemblies and embodied such that an orientation tendency between semiconductor directivity of ultra-small LED devices and different mounting electrodes does not exist according to Korean Patent Registration No. 436123 had a problem in that a luminance thereof is significantly degraded because some of the ultra-small LED devices did not emit light when DC driving power was used.

Accordingly, there is an urgent need to develop a full-color display in which ultra-small LED devices are connected to ultra-small electrodes without electrical short circuits, selection of driving power has no limits, luminance is further improved, and each pixel thereof has uniform luminance.

SUMMARY OF THE INVENTION

The present invention is directed to providing a full-color light emitting diode (LED) display including ultra-small LED electrode assemblies, in which an amount of light blocked by electrodes and not extracted is minimized and ultra-small LED devices are connected to ultra-small electrodes without defects such as electrical short circuits and the like, and a method of manufacturing the same.

In addition, the present invention is directed to providing a full-color LED display, in which selection of driving power of the full-color LED display has no limits, and thus a luminance characteristic exhibited when direct current (DC) driving power is used is higher than or equal to that exhibited when alternating current (AC) power is used, and a method of manufacturing the same.

Further, the present invention is directed to providing a full-color LED display, in which intensity of light emitted by pixels or subpixels is similar due to a DC driving voltage, and thus uniform luminance characteristics and color reproducibility are exhibited by the entire display, and a method of manufacturing the same.

Furthermore, the present invention is directed to providing a full-color LED display capable of having excellent color reproducibility due to significantly improved intensity of light emitted in a specific wavelength band, and a method of manufacturing the same.

According to an aspect of the present invention, there is provided a method of manufacturing a full-color LED display having an improved luminance, including forming subpixels, each of which includes at least one ultra-small LED electrode assembly configured to emit light having substantially the same light color, wherein a method of manufacturing the ultra-small LED electrode assembly includes: (1) introducing a solution including ultra-small LED devices to a mounting electrode line including a first mounting electrode and a second mounting electrode, which is formed on the same plane as the first mounting electrode and spaced apart from the first mounting electrode; and (2) self-mounting the ultra-small LED devices by applying power, which has an asymmetric assembly voltage of 10 V or more according to Equation 1, to the mounting electrode line such that one end of each of the ultra-small LED devices comes into contact with the first mounting electrode and the other end thereof comes into contact with the second mounting electrode.

$$\text{Asymmetric Assembly Voltage } (V) = ||A(V)| - |B(V)|| \quad \text{[Equation 1]}$$

Here, A indicates a magnitude of an upper end of a peak voltage of the applied power, and B indicates a magnitude of a lower end of the peak voltage thereof.

The power may have a frequency of 50 kHz to 1 GHz.

An insulating partition wall configured to surround the mounting electrode line may be formed, and then the ultra-small LED electrode assembly may be manufactured by introducing the solution including the plurality of ultra-small LED devices to the insulating partition wall.

The method may further include performing a thermal process on the ultra-small LED electrode assembly at a temperature of 200 to 1,000° C. for 0.5 to 10 minutes after the self-mounting of the ultra-small LED devices is performed.

The method may further include forming an ohmic layer and portions on which the first and second mounting electrodes are in contact with end portions of each of the ultra-small LED devices after the self-mounting of the ultra-small LED devices is performed.

The light color may be blue or white or may be the same as that of ultraviolet (UV) light.

The method may further include forming short-wavelength transmission filters on the formed subpixels; patterning green color conversion layers on the short-wavelength transmission filters corresponding to some subpixels selected among the subpixels, and patterning red color conversion layers on the short-wavelength transmission filters corresponding to some subpixels selected among the remaining subpixels; and forming long-wavelength transmission filters on portions including the green color conversion layers and the red color conversion layers.

The power may have an asymmetric assembly voltage of 18 V or more according to Equation 1.

The ultra-small LED device may have a length of 100 nm to 10 μm.

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

According to still another aspect of the present invention, there is provided a full-color LED display having an improved luminance, including subpixels, each of which includes at least one ultra-small LED electrode assembly configured to emit light having substantially the same light color, wherein: the ultra-small LED electrode assembly includes a mounting electrode line including a first mounting electrode and a second mounting electrode, which are formed on the same plane and spaced apart from each other, and ultra-small LED devices, which each have one end in contact with the first mounting electrode and the other end in contact with the second mounting electrode; and a luminance gain according to Equation 2 is 1.1 or more.

$$\text{Luminance Gain} = \frac{\text{Luminance of ultra-small }LED\text{ electrode assembly driven by DC voltage (cd/m}^2)}{\text{Luminance of ultra-small }LED\text{ electrode assembly driven by AC voltage (cd/m}^2)} \quad \text{[Equation 2]}$$

According to yet another aspect of the present invention, there is provided a full-color LED display having an improved luminance, including subpixels, each of which includes at least one ultra-small LED electrode assembly configured to emit light having substantially the same light color, wherein: the ultra-small LED electrode assembly includes a mounting electrode line including a first mounting electrode and a second mounting electrode, which are formed on the same plane and spaced apart from each other, and ultra-small LED devices including a first semiconductor layer and a second semiconductor layer, each of which one end is in contact with the first mounting electrode and the other end is in contact with the second mounting electrode; and a percentage of the ultra-small LED devices, of which the first semiconductor layer is in direct or indirect contact with the first mounting electrode, among all of the ultra-small LED devices in contact with the mounting electrode is 60% or more.

The ultra-small LED device may have an aspect ratio of 1.2 to 100. Further, the ultra-small LED device may have a length of 100 nm to 10 μm.

The ultra-small LED device may include a first semiconductor layer, an active layer formed on the first semiconductor layer, a second semiconductor layer formed on the active layer, and an insulating thin film configured to cover at least an entire outer surface of the active layer among outer surfaces of the ultra-small LED device. Here, one semiconductor layer among the first semiconductor layer and the second semiconductor layer may include at least one N-type semiconductor layer, and the other semiconductor layer may include at least one P-type semiconductor layer.

The ultra-small LED electrode assembly may have a luminance gain of 1.3 or more according to Equation 2.

In the ultra-small LED electrode assembly, the number of the mounted ultra-small LED devices per unit area (mm$^2$) may be 1,000 or more.

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

A percentage of the ultra-small LED devices, of which the first semiconductor layer is in contact with the first mounting electrode, among all of the ultra-small LED devices may be 80% or more.

The ultra-small LED electrode assembly may further include an ohmic layer and portions in which the first and second mounting electrodes are in contact with end portions of each of the ultra-small LED devices.

The light color may be blue or white or may be the same as that of ultraviolet (UV) light.

The full-color LED display may further include short-wavelength transmission filters formed on the subpixels; color conversion layers including green color conversion layers provided on the short-wavelength transmission filters corresponding to some subpixels selected among the subpixels and red color conversion layers provided on the short-wavelength transmission filters corresponding to some subpixels selected among the remaining subpixels; and long-wavelength transmission filters provided on the color conversion layers.

According to another aspect of the present invention, there is provided a method of manufacturing a full-color LED display having an improved luminance, including forming subpixels, each of which includes at least one ultra-small LED electrode assembly configured to emit light having substantially the same light color, wherein: the light color is divided into a different plurality of light color groups including a first light color, a second light color, and a third light color; and a method of manufacturing the ultra-small LED electrode assembly includes: (a) introducing a solution including ultra-small LED devices to a mounting electrode line including a first mounting electrode and a second mounting electrode, which is formed on the same plane as the first mounting electrode and spaced apart from the first mounting electrode; and (b) self-mounting the ultra-small LED devices by applying power, which has an asymmetric assembly voltage of 10 V or more according to Equation 1, to the mounting electrode line such that one end of each of the ultra-small LED devices comes into contact with the first mounting electrode and the other end thereof comes into contact with the second mounting electrode.

The power may have a frequency of 50 kHz to 1 GHz.

An insulating partition wall configured to surround the mounting electrode line may be formed, and then the ultra-small LED electrode assembly may be manufactured by introducing the solution including the plurality of ultra-small LED devices to the insulating partition wall.

The method may further include performing a thermal process on the ultra-small LED electrode assembly at a temperature of 200 to 1,000° C. for 0.5 to 10 minutes after the self-mounting of the ultra-small LED devices is performed.

After the self-mounting of the ultra-small LED devices is performed, the method may further include forming an ohmic layer and portions on which the first and second mounting electrodes are in contact with end portions of each of the ultra-small LED devices.

The power may have an asymmetric assembly voltage of 18 V or more according to Equation 1.

The ultra-small LED device may have a length of 100 nm to 10 μm.

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

Among the plurality of light color groups, the first light color may be blue, the second light color may be green, and the third light color may be red. Here, the plurality of light color groups may further include a fourth light color group of which a light color is white.

According to yet another aspect of the present invention, there is provided a full-color LED display having an improved luminance, including subpixels, each of which includes at least one ultra-small LED electrode assembly configured to emit light having substantially the same light color, wherein: the light color is divided into a plurality of different light color groups including a first light color, a second light color, and a third light color; the ultra-small LED electrode assembly includes: a mounting electrode line including a first mounting electrode and a second mounting electrode, which are formed on the same plane and spaced apart from each other; and ultra-small LED devices, which each have one end in contact with the first mounting electrode and the other end in contact with the second mounting electrode; and a luminance gain according to the following Equation 2 is 1.1 or more.

$$\text{Luminance Gain} = \frac{\text{Luminance of ultra-small } LED \text{ electrode assembly driven by DC voltage (cd/m}^2\text{)}}{\text{Luminance of ultra-small } LED \text{ electrode assembly driven by AC voltage (cd/m}^2\text{)}} \quad \text{[Equation 2]}$$

Here, a magnitude of an applied direct current (DC) voltage V is equal to that of an effective voltage (Vrms) of sine wave alternating current (AC) power.

According to yet another aspect of the present invention, there is provided a full-color LED display having an improved luminance, including subpixels, each of which includes at least one ultra-small LED electrode assembly configured to emit light having substantially the same light color, wherein: the light color is divided into a plurality of different light color groups including a first light color, a second light color, and a third light color; the ultra-small LED electrode assembly includes a mounting electrode line including a first mounting electrode and a second mounting electrode, which are formed on the same plane and spaced apart from each other, and ultra-small LED devices including a first semiconductor layer and a second semiconductor layer, which each have one end in contact with the first mounting electrode and the other end in contact with the second mounting electrode; and a percentage of the ultra-small LED devices, of which the first semiconductor layer is in direct or indirect contact with the first mounting electrode, among all of the ultra-small LED devices in contact with the mounting electrode is 60% or more.

The ultra-small LED device may have an aspect ratio of 1.2 to 100. Further, the ultra-small LED device may have a length of 100 nm to 10 µm.

The ultra-small LED device may include a first semiconductor layer, an active layer formed on the first semiconductor layer, a second semiconductor layer formed on the active layer, and an insulating thin film configured to cover at least an entire outer surface of the active layer among outer surfaces of the ultra-small LED device. Here, one semiconductor layer among the first semiconductor layer and the second semiconductor layer may include at least one N-type semiconductor layer, and the other semiconductor layer may include at least one P-type semiconductor layer.

The ultra-small LED electrode assembly may have a luminance gain of 1.3 or more according to Equation 2.

In the ultra-small LED electrode assembly, the number of the mounted ultra-small LED devices per unit area ($mm^2$) may be 1,000 or more.

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

A percentage of the ultra-small LED devices, of which the first semiconductor layer is in contact with the first mounting electrode, among all of the ultra-small LED devices may be 80% or more.

The ultra-small LED electrode assembly may further include an ohmic layer and portions in which the first and second mounting electrodes are in contact with end portions of each of the ultra-small LED devices.

Among the plurality of light color groups, the first light color may be blue, the second light color may be green, and the third light color may be red. Here, the plurality of light color groups may further include a fourth light color group of which a light color is white.

Hereinafter, the terms used in the present invention will be described.

In the description of embodiments according to the present invention, the term "mounting electrode line" may include any case of an electrode line which is directly contactable with both end portions of an ultra-small LED device, i.e., the ultra-small LED device is substantially mountable thereon.

In the description of the embodiments according to the present invention, when each of layers, regions, patterns, or structures is described as being formed "on," "an upper portion of," "above," "under," "a lower portion of," or "below" a substrate, a layer, a region, or a pattern, the terms "on," "upper portion," "above," "under," "lower portion," and "below" include the meaning of "directly" and "indirectly."

In the description of the embodiments according to the present invention, the term "contact" refers that Component 1 is directly structurally connected to Component 2 or is indirectly structurally connected to Component 2 through Component 3. For example, the term "a first semiconductor layer in contact with a first mounting electrode" refers to the first semiconductor layer being directly structurally connected to the first mounting electrode and also refers to an electrode layer being formed on the first semiconductor layer and the electrode layer being directly structurally connected to the first mounting electrode and thus the first semiconductor layer is indirectly connected to the first mounting electrode. Meanwhile, the term "structurally connected" does not refer to an electrical connection state related to whether an ultra-small LED device emits light when driving power is applied to an electrode line, but refers to any case of a physical contact state even when electrical connection is not established.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 2A and 2B are schematic plan views illustrating a full-color LED display according to one embodiment of the present invention, wherein FIG. 2A is a view illustrating a process of forming electrode lines in a lattice form by separately disposing two electrode lines on different planes, and FIG. 2B is a view illustrating a process of forming two electrode lines in a lattice form on the same plane, wherein an insulating layer is interposed between overlapping portions of the two electrode lines;

FIGS. 3A and 3B are views illustrating mounting electrode lines of an ultra-small LED electrode assembly included in one embodiment of the present invention, wherein FIG. 3A is a view illustrating the mounting electrode lines in which two mounting electrodes are alternately disposed, and FIG. 3B is a view illustrating the mounting electrode lines in which two mounting electrodes are alternately disposed in a vortex form;

FIGS. 4A and 4B are views illustrating mounting electrode lines of an ultra-small LED electrode assembly included in one embodiment of the present invention, wherein FIG. 4B is a view illustrating the mounting electrode lines having an insulating partition wall surrounding edges of the mounting electrode lines shown in FIG. 4A;

FIGS. 7A to 7C are views illustrating an ultra-small LED electrode assembly manufactured using a conventional method, wherein FIG. 7A is a perspective view of the ultra-small LED electrode assembly, FIG. 7B is a light emission picture when alternating current (AC) power is applied thereto as driving power, and FIG. 7C is a light emission picture when direct current (DC) power is applied thereto as the driving power;

FIGS. 8A to 8C are schematic views illustrating electrostatic attraction between an ultra-small LED device and mounting electrodes under an electric field, wherein FIG. 8A is a schematic view before power is applied to the mounting electrodes, FIG. 8B is a schematic view when symmetric assembly power is applied to the mounting electrodes, and FIG. 8C is a schematic view when asymmetric assembly power is applied to the mounting electrodes;

FIGS. 10A to 10C are views illustrating an ultra-small LED electrode assembly provided in one embodiment of the present invention, wherein FIG. 10A is a perspective view illustrating the ultra-small LED electrode assembly, FIG. 10B is a light emission picture when AC power is applied thereto as driving power, and FIG. 10C is a light emission picture when DC power is applied thereto as the driving power;

FIGS. 12A and 12B are views illustrating an ultra-small LED electrode assembly included in one embodiment of the present invention, wherein FIG. 12A is a light emission picture when AC power is applied thereto as driving power, and FIG. 12B is a light emission picture when DC power is applied thereto as the driving power;

FIGS. 14A and 14B are views illustrating a full-color LED display according to one embodiment of the present invention, wherein FIG. 14A is a view illustrating an RGB LED display, and FIG. 14B is a view illustrating an RGBW LED display.

DETAILED DESCRIPTION OF EMBODIMENTS

Figure 1:
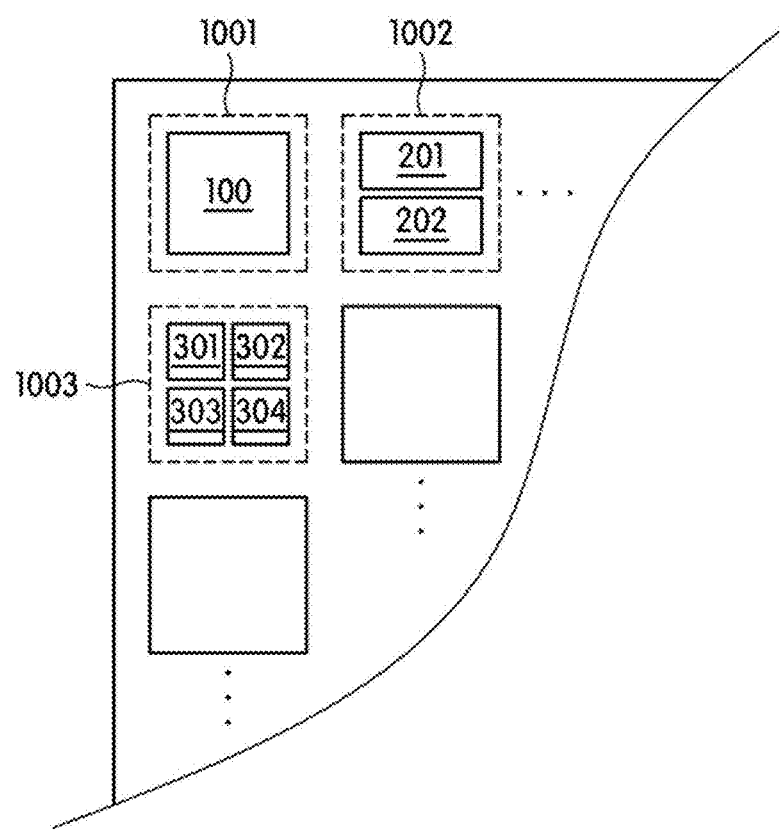
FIG. 1 is a schematic plan view illustrating a full-color light emitting diode (LED) display according to one embodiment of the present invention.

Hereinafter, exemplary embodiments of the present invention will be described in detail with reference to the accompanying drawings, which will be readily apparent to those skilled in the art to which the present invention belongs. The present invention may be embodied in many different forms and is not limited to the embodiments described herein. In order to clearly illustrate the present invention in the following drawings, parts not related to the description will be omitted, and the same reference numerals are used throughout the specification to refer to the same or similar components.

A method of manufacturing a full-color light emitting diode (LED) display according to a first embodiment of the present invention may include forming subpixels, each of which includes at least one ultra-small LED electrode assembly configured to emit light having substantially the same light color.

Referring to FIG. 1, a method of manufacturing a display may include forming a plurality of subpixels 1001, 1002, and 1003, and the subpixel may be formed so that one or more ultra-small LED electrode assemblies 100, 201, 202, 301, 302, 303, and 304 are provided in each of the subpixels 1001, 1002, and 1003. For example, one ultra-small LED electrode assembly 100 may form one subpixel, e.g., a first subpixel 1001. Alternatively, two ultra-small LED electrode assemblies 201 and 202 may form one subpixel, e.g., a second subpixel 1002. Alternatively, four ultra-small LED electrode assemblies 301, 302, 303, and 304, may form one subpixel, e.g., a third subpixel 1003. The number of ultra-small LED electrode assemblies provided in each subpixel may vary and may be implemented according to a total area and resolution of an embodied LED display and light efficiency of an LED device.

One or more ultra-small LED electrode assemblies provided in each of the subpixels emit light having substantially the same light color. Here, the term "substantially the same light color" does not refer to completely the same wavelength of emitted light and refers to a light color of light in a wavelength band in which light generally referred to as light having the same light color is included. For example, when the light color is blue, all ultra-small LED electrode assemblies configured to emit light in a wavelength band of 420 to 470 nm may be understood as emitting light having substantially the same light color. Further, "light color" refers to a light color of light emitted by an entire ultra-small LED electrode assembly and does not refer to only light color of light emitted by ultra-small LED devices provided in the ultra-small LED electrode assembly. For example, when an ultra-small LED electrode assembly emits white light, the ultra-small LED electrode assembly may be provided with all of ultra-small red LEDs, ultra-small green LEDs, and ultra-small blue LEDs to emit light similar to white light or may be provided with only ultra-small blue LED devices and further provided with a yellow phosphor on the electrode assembly.

The ultra-small LED electrode assembly provided in the display according to the first embodiment of the present invention may emit blue light, white light, or ultraviolet (UV) light.

Meanwhile, an electrode arrangement of data electrodes, gate electrodes, and the like provided in a general display is not illustrated in FIG. 1, but the electrode arrangement used in the general display may be used as the electrode arrangement which is not illustrated. Mounting electrode lines including a first mounting electrode and a second mounting electrode, which is formed on the same plane as the first mounting electrode and spaced apart from the first mounting electrode, may be disposed at subpixel sites at which subpixels are formed according to the electrode arrangement of the display. For example, the subpixels 1001, 1002, and 1003 may be located in a region surrounded by electrodes in a lattice form electrode arrangement, as shown in FIG. 2A.

Figure 2A:
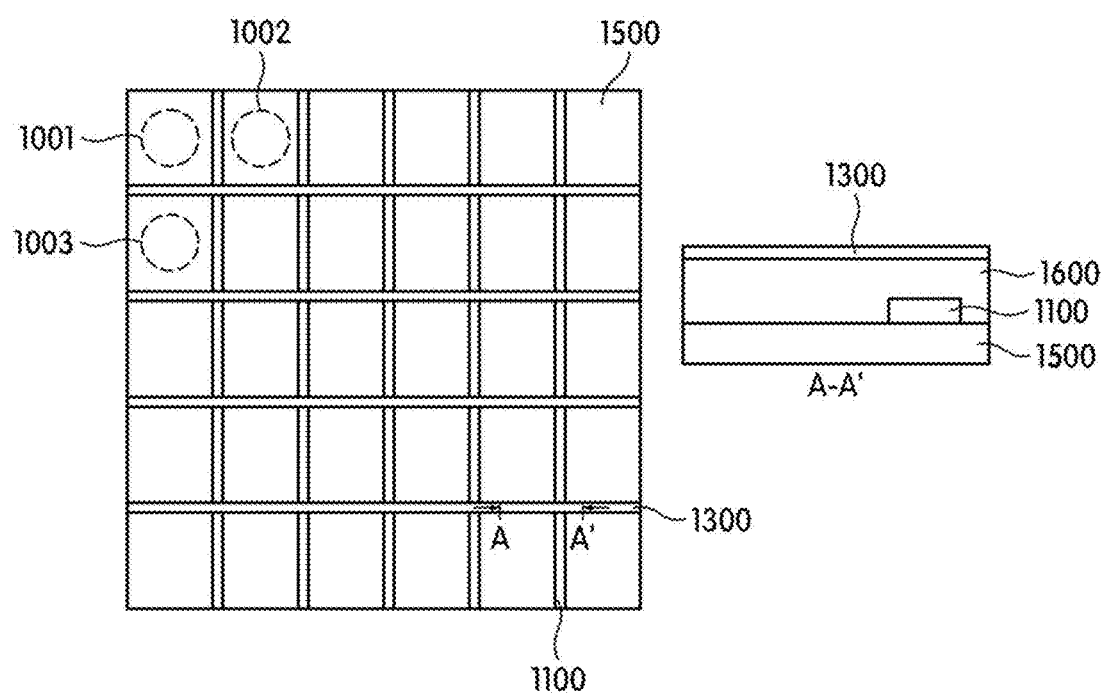
Figure 3A:
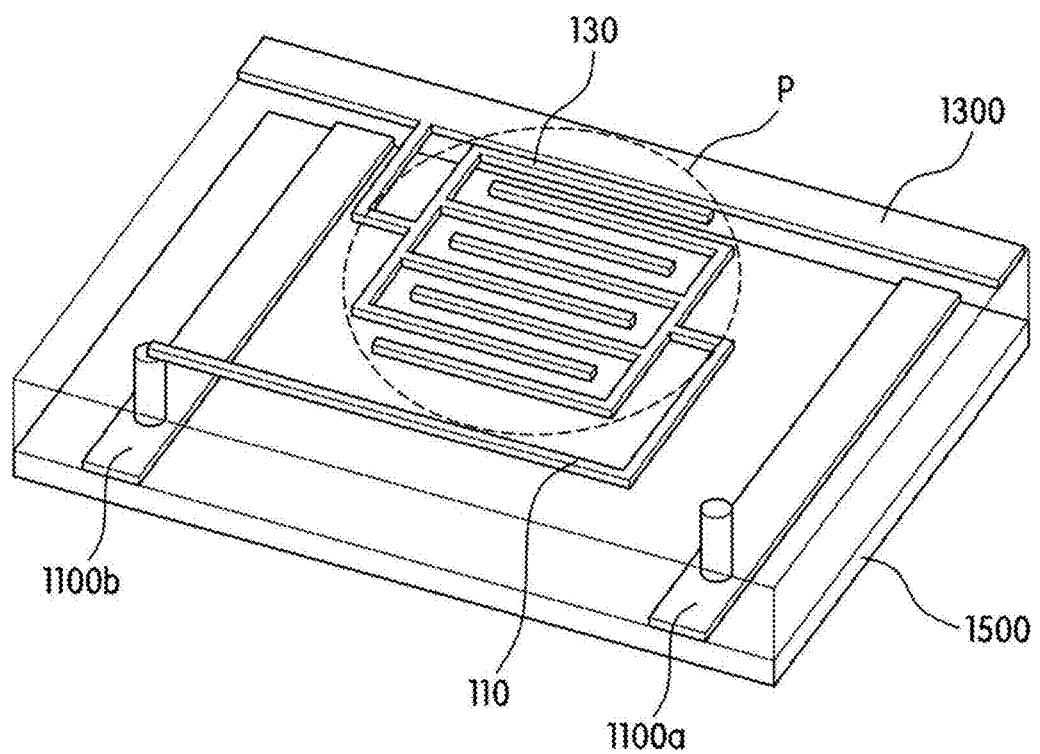
Figure 3B:
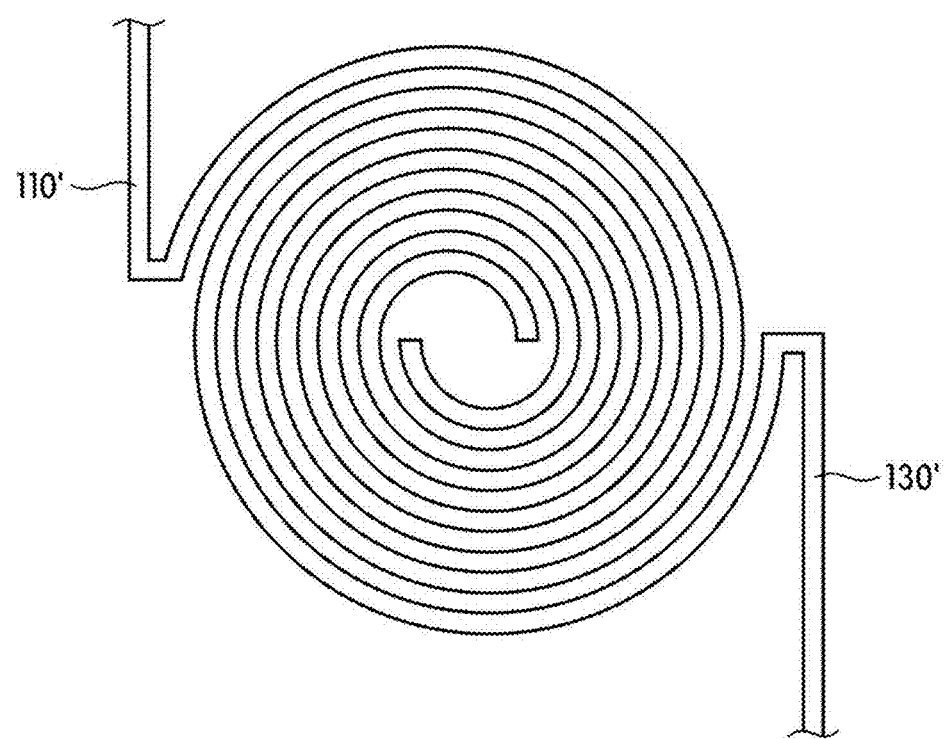

Meanwhile, in order to separately form the first mounting electrode and the second mounting electrode on the same plane in the mounting electrode lines provided in the ultra-small LED electrode assembly, when an $I^{th}$ electrode 1100 connected to the first mounting electrode (not shown) is a positive electrode (or a negative electrode) in FIG. 2A, an $II^{th}$ electrode 1300 connected to the second mounting electrode (not shown) has to be a negative electrode (or a positive electrode). Therefore, in order to prevent a contact between the $I^{th}$ electrode 1100 and the $II^{th}$ electrode 1300, the $II^{th}$ electrode 1300 may be separately disposed on the $I^{th}$ electrode 1100, as shown in a partially enlarged cross-sectional view taken along line A-A' of FIG. 2A. Specifically, FIG. 3A is a view of an example of the mounting electrode lines of the ultra-small LED electrode assembly provided at the subpixel sites of the electrode arrangement shown in FIG. 2A, and a first mounting electrode 110 is connected to the $I^{th}$ electrode 1100 disposed thereunder, a second mounting electrode 130 is disposed on the same plane as the first mounting electrode 110, and the second mounting electrode 130 and the $I^{th}$ electrode 1100 are disposed in a lattice form, wherein the second mounting electrode 130 may be connected to the $II^{th}$ electrode 1300 formed thereabove to prevent a mutual contact between the electrodes. Here, the first mounting electrode 110 and the second mounting electrode 130 may be separately disposed and may form mounting electrode lines P by being alternately disposed such that as many ultra-small LED devices as possible are mounted thereon. Meanwhile, the first mounting electrode 110 and the second mounting electrode 130 of the mounting electrode lines P shown in FIG. 3A may be changed into a first mounting electrode 110' and a second mounting electrode 130' separately disposed in a vortex form shown in FIG. 3B, and therefore, a specific form of the mounting electrode lines may be changed according to a purpose thereof and the present invention is not particularly limited to the above forms.

Figure 2B:
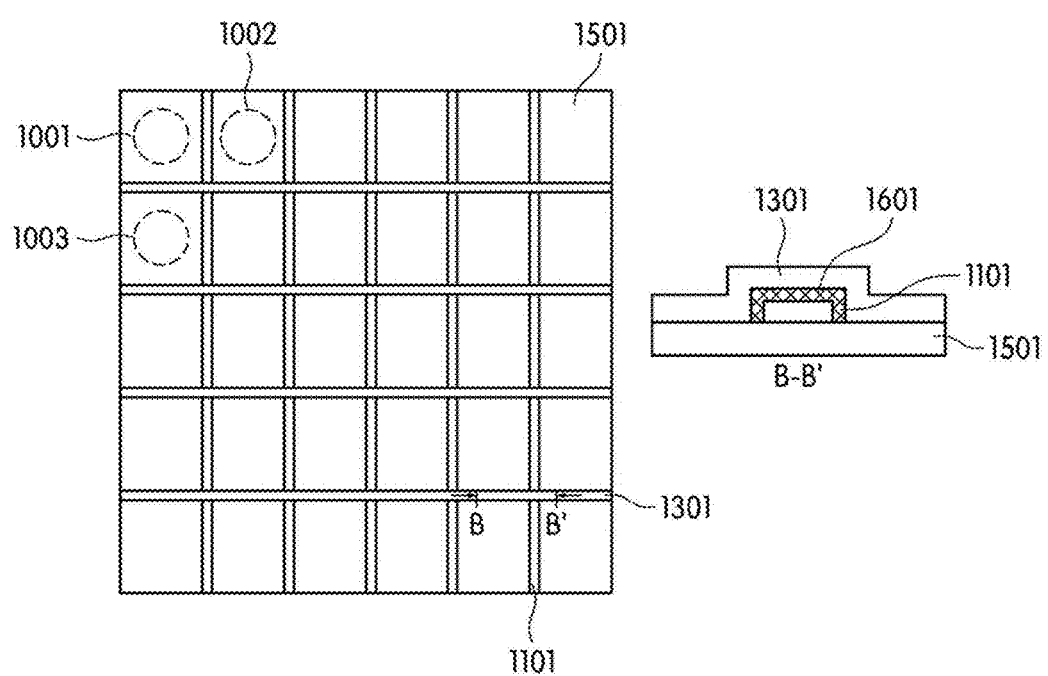

Alternatively, the $I^{th}$ electrode 1100 and the $II^{th}$ electrode 1300 are disposed in a lattice form, as shown in FIG. 2B, wherein the electrodes may be arranged so that an insulating layer 1601 is interposed between overlapping portions of the $I^{th}$ electrode 1100 and the $II^{th}$ electrode 1300 to prevent electrical short circuits as shown in a partially enlarged cross-sectional view taken along line B-B'.

Meanwhile, an electrode structure, an arrangement, a material, and the like used in the display according to the present invention may be replaced with those in a disclosure, i.e., Korean Patent Registration No. 436123, made by the present inventor, and may also be replaced with an electrode structure, an arrangement, a material, and the like used in a general display, and thus the present invention may omit detailed descriptions thereof.

Hereinafter, a method of manufacturing an ultra-small LED electrode assembly by mounting ultra-small LED devices on mounting electrode lines formed at subpixel sites will be described in detail. The method of manufacturing an ultra-small LED electrode assembly may include (1) introducing a solution including a plurality of ultra-small LED devices to mounting electrode lines including a first mounting electrode and a second mounting electrode, which is formed on the same plane as the first mounting electrode and spaced apart from the first mounting electrode, and (2) self-mounting the ultra-small LED devices by applying power having an asymmetric assembly voltage of 10 V or more according to the following Equation 1 to the mounting electrode lines such that one end of each of the ultra-small LED devices comes into contact with the first mounting electrode and the other end thereof comes into contact with the second mounting electrode.

Figure 4A:
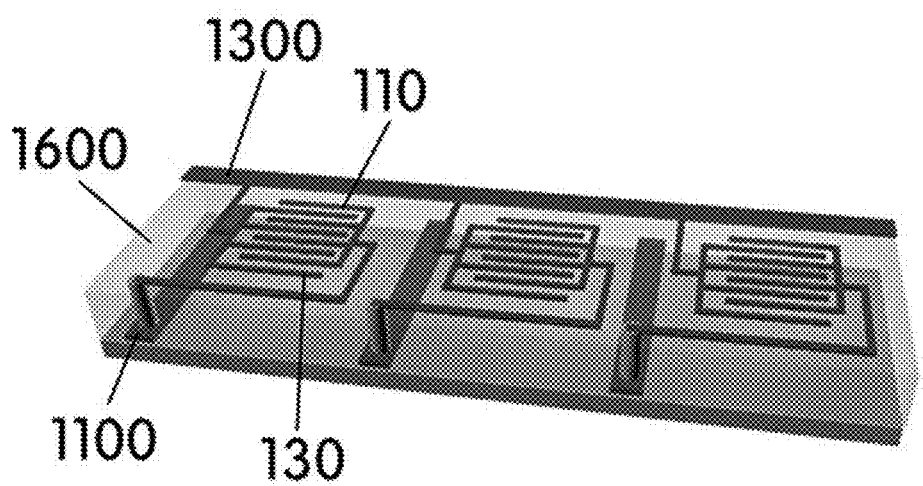

First, in operation (1), after mounting electrode lines P1, P2, and P3 including the first mounting electrode 110 and the second mounting electrode 130, which is formed on the same plane as the first mounting electrode 110 and spaced apart from the first mounting electrode 110, are provided, as shown in FIG. 4A, the introduction of the solution including the plurality of ultra-small LED devices is performed on mounting electrode lines P1, P1', and P1".

Figure 5:
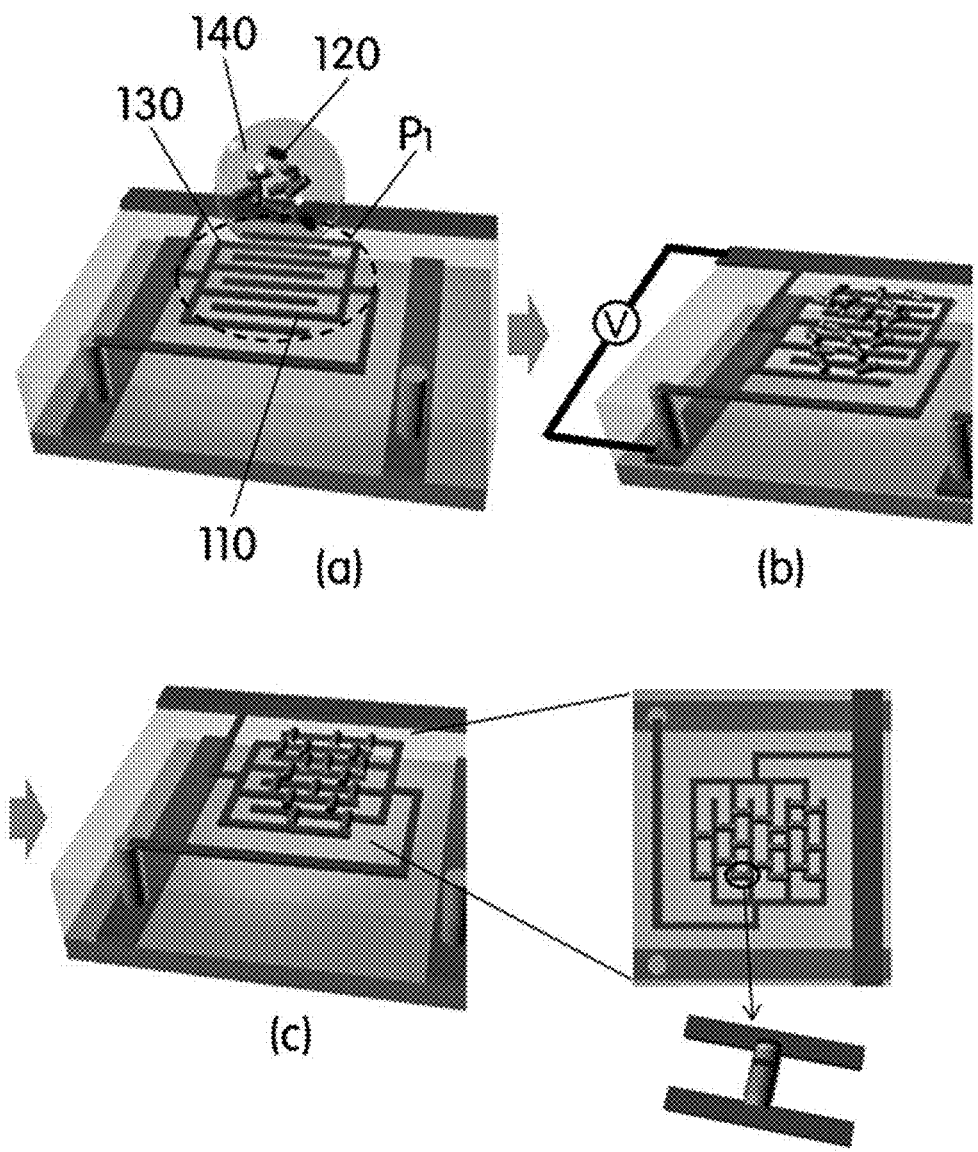
FIG. 5 is a schematic view illustrating a method of manufacturing an ultra-small LED electrode assembly provided in one embodiment of the present invention.

Specifically, FIG. 5A illustrates a solution 120 and 140, in which the plurality of ultra-small LED devices 120 are dispersed in a solvent 140, to be introduced to the mounting electrode line P1. Here, since an insulating layer 1600 is disposed under the mounting electrode line P1, leakage of the solution under the mounting electrode line P1 may be prevented.

Figure 4B:
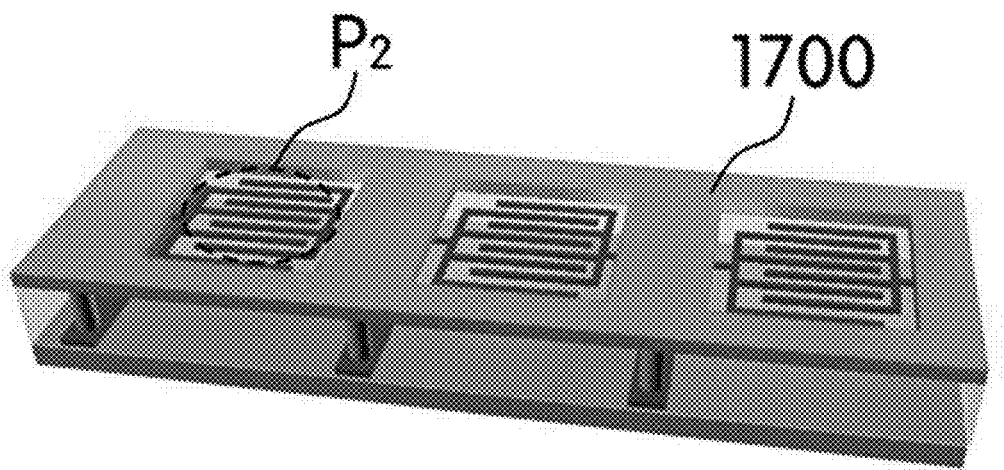
Figure 6:
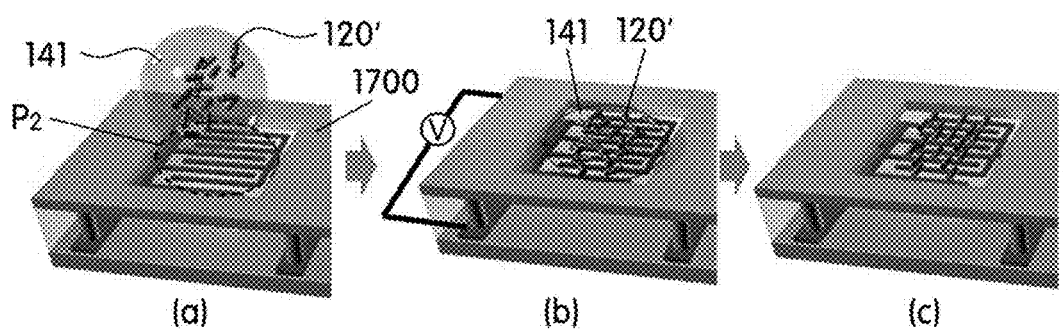
FIG. 6 is a schematic view illustrating a method of manufacturing an ultra-small LED electrode assembly provided in one embodiment of the present invention.

Meanwhile, when the solution 120 and 140 including the ultra-small LED devices is introduced to the mounting electrode line P1 as shown in FIG. 5A, the solution does not stay on the mounting electrode line P1 and spreads outside of the mounting electrode line P1 when the solution 120 and 140 is introduced. Therefore, there is a problem in that the ultra-small LED devices are concentrated and disposed on edge portions of the mounting electrode line or moved outside of the mounting electrode line, and thus the ultra-small LED devices are not mounted on the mounting electrode line and are useless. To solve the above problem, the ultra-small LED electrode assembly may further include an insulating partition wall 1700 surrounding edges of the mounting electrode line P2, as shown in FIG. 4B, or a solution 120' and 141 including the ultra-small LED devices is introduced to the insulating partition wall 1700, as shown in FIG. 6A, to prevent the ultra-small LED devices from being disposed due to non-uniform spreading of the solution.

Meanwhile, detailed descriptions of a manufacturing method, a structure, the solvent introduced to the solution of the insulating partition wall, the number of the ultra-small LED devices in the solution, and the like may be replaced with those in a disclosure, Korean Patent Registration No. 2014-0085384, and thus the detailed description thereof in the present invention will be omitted.

According to one embodiment of the present invention, an insulating film may be further provided on outer surfaces of the first mounting electrode and the second mounting electrode. Due to a distance between the first mounting electrode and the second mounting electrode reduced due to the insulating film, the ultra-small LED device may be self-mounted so that all of both ends thereof are located on the first mounting electrode and the second mounting electrode. In this case, the number of ultra-small LED devices that can be mounted may be increased due to improvement of mounting alignment of the ultra-small LED devices, and a more highly-efficient ultra-small LED electrode assembly may be easily implemented. Further, in step (2) described below, the ultra-small LED devices may be introduced into the first mounting electrode and the second mounting electrode in a mixed state with the solvent. When power is applied to the ultra-small LED devices in order to self-mount thereof, electrical short-circuit may occur between two different mounting electrodes due to the solvent, and thus the electrodes may be damaged. However, there is an advantage in that electrical short-circuit between the electrodes due to the solvent may be prevented by the insulating film provided on the outer surfaces of the first mounting electrode and the second mounting electrode.

Next, in operation (2) of the present invention, the self-mounting of the ultra-small LED devices by power having an asymmetric assembly voltage of 10 V or more according to Equation 1 in accordance with the present invention being applied to the mounting electrode lines is performed such that one end of each of the ultra-small LED devices comes into contact with the first mounting electrode and the other end thereof comes into contact with the second mounting electrode.

In operation (2), an electric field is formed in the mounting electrode lines, and components are moved to, arranged, and self-mounted on the mounting electrode lines through various physical forces such as polarization generated in the ultra-small LED devices, electrostatic attraction between the polarized ultra-small LED device and the mounting electrode lines adjacent thereto, and the like under the electric field. However, in order to improve an orientation tendency of the ultra-small LED devices to be mounted so that the devices are moved to and arranged on electrodes and a first semiconductor layer in the device is in contact with the first mounting electrode, power having an asymmetric assembly voltage of 10 V or more according to Equation 1 has to be applied to the mounting electrode lines.

$$\text{Asymmetric Assembly Voltage } (V) = ||A(V)| - |B(V)|| \quad \text{[Equation 1]}$$

Here, A indicates a magnitude of an upper end of a peak voltage of the applied power, and B indicates a magnitude of a lower end of the peak voltage thereof.

Figure 7A:
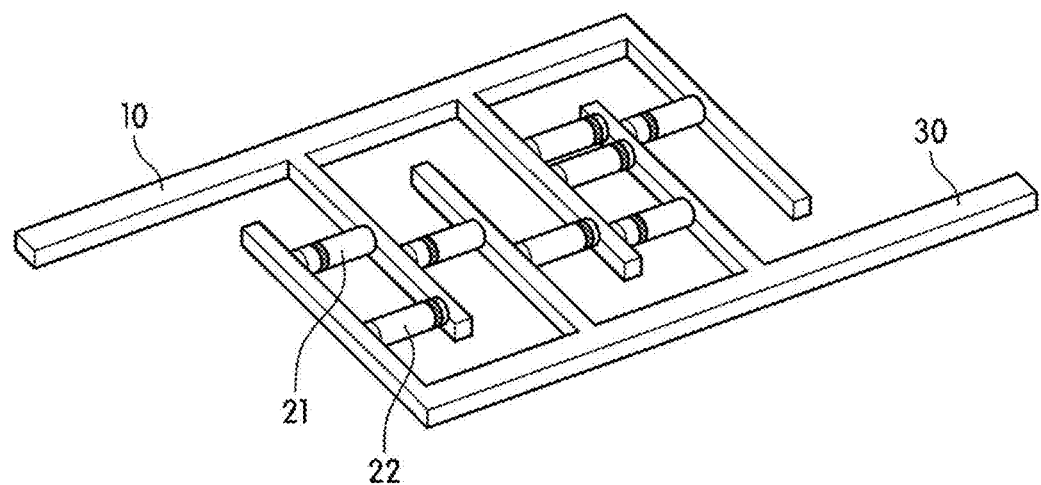
Figure 7B:
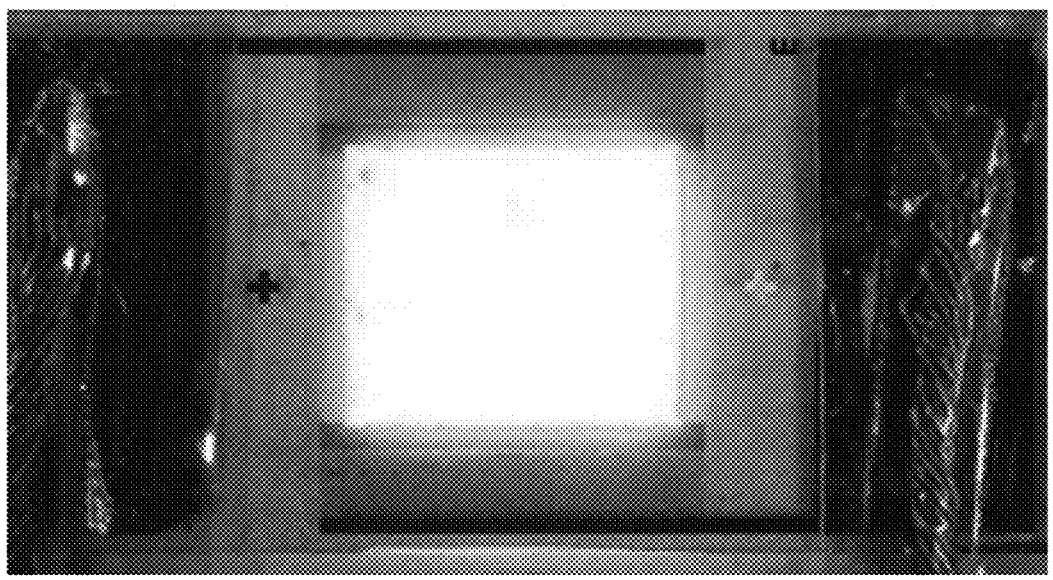
Figure 7C:
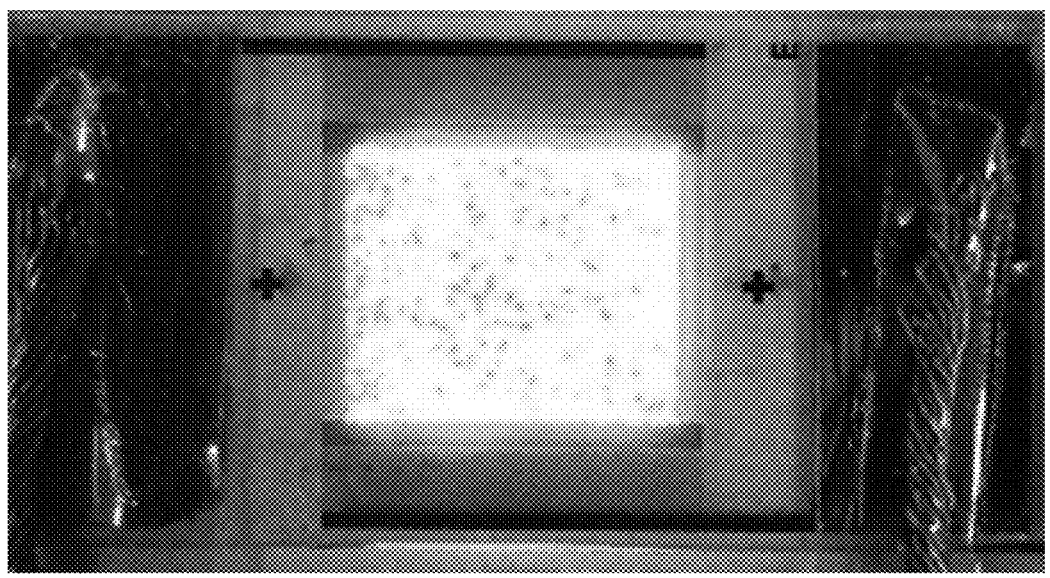

In a conventional ultra-small LED electrode assembly made by the present inventor, power applied in operation (2) had a symmetric assembly voltage of 0 V according to Equation 1. However, since an orientation by which one specific end of each ultra-small LED device is in contact with a specific mounting electrode was randomly determined when such a symmetric assembly voltage was used, the ultra-small LED devices were not mounted to have proper orientation, and thus alternating current (AC) power had to be used as driving power. Specifically, FIG. 7A is a schematic view illustrating an ultra-small LED electrode assembly implemented using a symmetric assembly voltage of 0 V according to Equation 2, and it was determined that the ultra-small LED electrode assembly may emit light when AC power was used as the driving power, as shown in FIG. 7B. However, when direct current (DC) power different from the above driving power was applied to an ultra-small LED electrode assembly which was the same as that implemented using the symmetric assembly voltage shown in FIG. 7B, it was determined that emission efficiency was different from that shown in FIG. 7B and was significantly decreased, as shown in FIG. 7C. This result means that a problem occurred when the ultra-small LED electrode assembly implemented using the symmetric assembly voltage shown in FIG. 7A used the DC power as the driving power.

The reason for a decrease in luminance when DC driving power is applied as shown in FIG. 7C is that there is no orientation tendency between different mounting electrodes in direct or indirect contact with different semiconductors (e.g., a P-type semiconductor and an N-type semiconductor) of an ultra-small LED device in the electrode assembly. Specifically, as shown in FIG. 7A, among eight ultra-small LED devices mounted on the ultra-small LED electrode assembly, the number of devices, which are identical to a first ultra-small LED device 21, in contact with the first mounting electrode 10 is four, and the remaining four ultra-small LED devices, which are different from the first ultra-small LED device 21, are in contact with the first mounting electrode 10. Therefore, when unidirectional DC driving power is applied to the ultra-small LED electrode assembly shown in FIG. 7A, only four ultra-small LED devices emit light, and the remaining four ultra-small LED devices do not emit light, and thus a luminance of the ultra-small LED electrode assembly is lowered.

In conclusion, when the conventional method of applying a symmetric assembly voltage to ultra-small LED devices and self-aligning the ultra-small LED devices is used, both end portions of each of the ultra-small LED devices are only in contact with two different electrodes, and the ultra-small LED devices may not be mounted on the mounting electrodes with a desired orientation therebetween. Therefore, in all probability, an ultra-small LED electrode assembly that exhibits high luminance using DC driving power cannot be manufactured.

However, when an asymmetric voltage is used instead of a symmetric voltage and power having an asymmetric voltage of 10 V or more according to Equation 1 in accordance with the present invention for a degree of asymmetry of the asymmetric voltage is applied to the ultra-small LED electrode assembly, an orientation between the ultra-small LED devices and the mounting electrodes may be desirably adjusted, and thus a display can be driven using DC driving power and the driven display can also exhibit very excellent luminance characteristics.

Figure 8A:
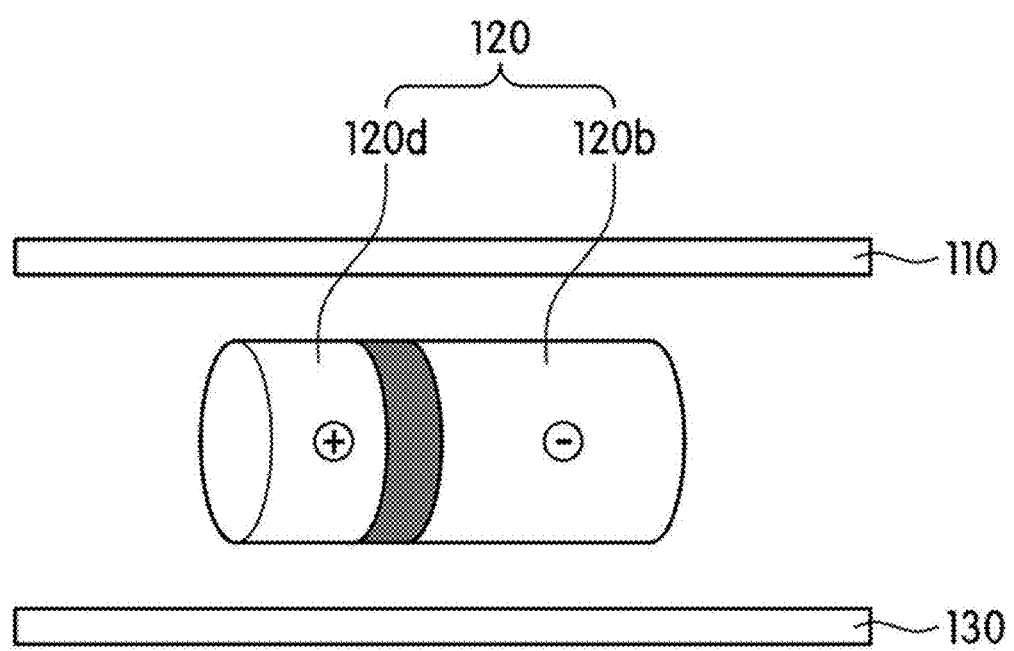
Figure 8B:
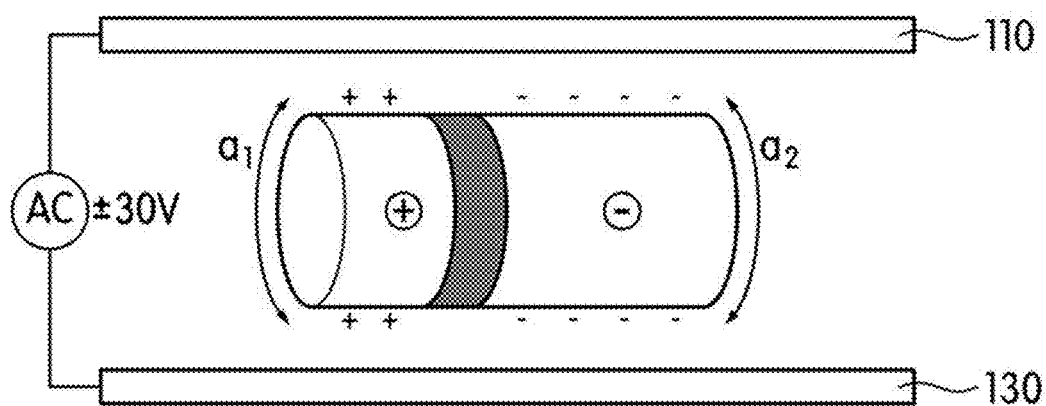

The orientation between ultra-small LED devices and mounting electrodes, which is affected by the asymmetric voltage, will be described with reference to FIG. 8. Specifically, FIG. 8A shows a state immediately after operation (1) is performed, and shows an ultra-small LED device 120 provided with a first semiconductor layer 120b and a second semiconductor layer 120d disposed on mounting electrode lines 110 and 130. Although not shown in FIG. 8A, the ultra-small LED device 120 is mixed into a solvent. In order to mount the ultra-small LED device in a state of FIG. 8A, voltages ($V_{AC}=\pm 30$ V) of which peaks are symmetric are conventionally applied to the first mounting electrode 110 and the second mounting electrode 130, as shown in FIG. 8B, and, in this case, magnitudes a1 and a2 of electrostatic attraction, which is applied to the ultra-small LED device and shown in FIG. 8B, of the two electrodes may be the same when lengths of the first semiconductor layer 120b and the second semiconductor layer 120d are the same and all other influences around the layers are not considered. Here, a probability of the first semiconductor layer 120b coming into contact with the first mounting electrode 110 may be 50%. In a broader sense, the first semiconductor layer 120b of each of the plurality of ultra-small LED devices introduced to the mounting electrode may come into contact with the first mounting electrode 110 at about a 50% probability, and a probability of a total of 10 ultra-small LED devices being mounted and coming into contact with the first mounting electrode 110 may be only $(0.5)^{10}$.

Figure 8C:
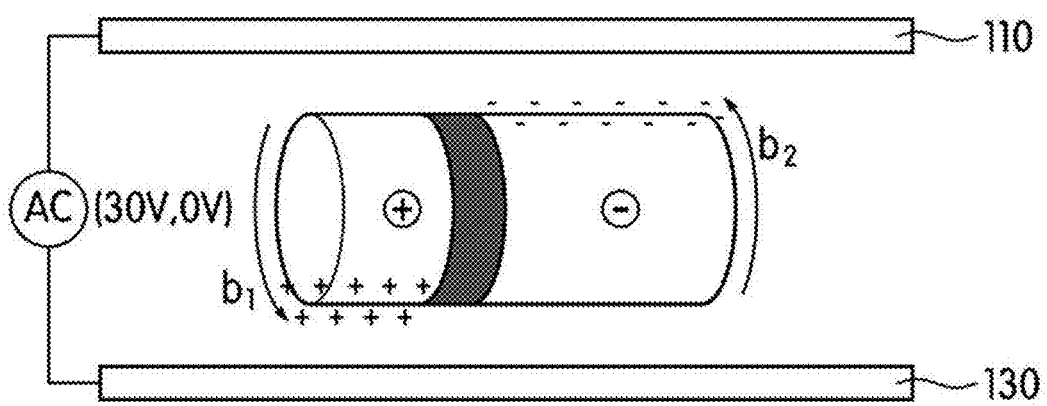

However, when asymmetric voltages are applied to the first mounting electrode 110 and the second mounting electrode 130, as shown in FIG. 8C, polarization of a surface of the ultra-small LED device is formed differently from that of FIG. 8B, and thus electrostatic attraction b1 and b2, which moves the first semiconductor layer 120b toward the first mounting electrode 110 and moves the second semiconductor layer 120d toward the second mounting electrode 130, is strengthened, a probability of the first semiconductor layer 120b coming into contact with the first mounting electrode 110 is further increased, and, in a broader sense, the plurality of ultra-small LED devices introduced to the mounting electrode may have a proper orientation and may more easily come into contact with the first mounting electrode.

However, immediately after operation (1) is performed, all of the ultra-small LED devices are not disposed in parallel between the two electrode, as shown in FIG. 8A. Some of the ultra-small LED devices may be obliquely disposed with different slopes, or some of the ultra-small LED devices may be disposed on one of the mounting electrodes. Further, the semiconductor layers included in the ultra-small LED devices may be asymmetrically formed and have different lengths. Therefore, in order to further improve an orientation tendency of a specific semiconductor layer of the ultra-small LED device coming into contact with a specific mounting electrode in consideration of the above states, an asymmetric voltage of assembly power applied to the mounting electrodes has to be 10 V or more according to Equation 1 and may preferably be 14 V or more, more preferably be 18 V or more, and most preferably be 25 V or more. When the asymmetric assembly voltage according to Equation 1 is less than 10 V, the orientation tendency of the specific semiconductor layer of the ultra-small LED device coming into contact with the specific mounting electrode is decreased, a luminance of some of the manufactured ultra-small LED electrode assemblies is significantly degraded when DC driving power is applied to the manufactured ultra-small LED electrode assemblies in comparison to when AC driving power is applied thereto, and thus luminances of subpixels may be different from each other, and, as a result, a resolution, color reproducibility, or the like of an image may be degraded. Meanwhile, when the asymmetric assembly voltage according to Equation 1 is more than 50 V, there is no problem regarding orientation of a specific direction of the ultra-small LED device, but the electrodes may be damaged.

Here, in the Equation 1, A and B do not refer to voltages applied to the first mounting electrode and the second mounting electrode, respectively. That is, when power having 30 V and power having 0 V are repeatedly applied to the first mounting electrode in a predetermined cycle and power having 0 V and power having 30 V are repeatedly applied to the second mounting electrode in the predetermined cycle, the power applying method is the same as the manner in which voltages of +30 V and −30 V are applied to the mounting electrode lines as a pulse wave in the predetermined cycle. Further, in this case, a value according to Equation 1 is zero, and symmetric voltages are applied to the mounting electrode lines.

Further, according to one embodiment of the present invention, the power may be power having the predetermined cycle and may be power in a sine waveform preferably having a frequency of 50 kHz to 1 GHz, and more preferably having a frequency of 90 kHZ to 100 MHz.

When the power is applied to the mounting electrodes without a cycle, i.e., a predetermined constant voltage is continuously applied thereto, the mounting electrodes may be damaged even when the above-described Equation 1 is satisfied, and the mounted ultra-small LED device may not be driven by the mounting electrodes when the damage is high.

Further, when the frequency is lower than 50 kHz, the number of mounted ultra-small LED devices is significantly decreased even when the voltage range is satisfied, an orientation of the devices is very irregular, and thus DC power may not be used as driving power. Further, when the frequency is higher than 1 GHz, the ultra-small LED devices may not adapt to a rapidly changing power, mountability of the devices is degraded, the orientation thereof is also degraded, and thus DC power cannot be used as driving power, like in the case of low frequencies.

Meanwhile, an effective voltage (Vrms) of the above-described power may preferably be 12 V or more, and may more preferably be 17 V or more, because the number of mounted ultra-small LED devices may be decreased when the effective voltage of the power is low. That is, when an ultra-small LED electrode assembly is embodied by power which satisfies a value according to the above-described Equation 1 being applied thereto, the ultra-small LED electrode assembly may be driven by DC power due to an increased mounting tendency of a specific semiconductor layer of the ultra-small LED device being electrically connected to a specific mounting electrode, but, since the number of the mounted ultra-small LED devices is low, an amount of emitted light may be significantly small when driving power is applied to the ultra-small LED electrode assembly.

Meanwhile, as operation (3), after operation (2) is performed, a thermal process may be further performed on the ultra-small LED devices self-mounted on the mounting electrode lines at a temperature of 200 to 1000° C., preferably in the range of 300 to 1,000° C., and more preferably in the range of 600 to 1,000° C., for 0.5 to 10 minutes. The thermal process is a process of removing the introduced solvent which easily moves and arranges the ultra-small LED devices after the ultra-small LED devices are in contact with different mounting electrodes. In a state in which the solvent is not completely removed, when driving power is applied or an ohmic layer configured to decrease a contact resistance between the mounting electrodes and the ultra-small LED devices is formed, the ultra-small LED electrode assembly may have a low emission efficiency which is lower than a targeted level. Further, the remaining solvent causes defects during a process of forming the ohmic layer, and even when the ohmic layer is formed, the level of the formation may be low and a large current loss may occur. When the thermal process is performed at a temperature of 200° C. or lower and/or for 0.5 minutes or less, a problem in that impurities are not completely removed and a problem in that a contact reaction between the ultra-small LED devices and the mounting electrodes are not completed may occur, and when the thermal process is performed at a temperature of more than 1,000° C. and/or for more than 10 minutes, a problem in that a base substrate and/or electrodes are deformed or broken and a problem in that a voltage is not suitably applied to the ultra-small LED devices due to an increased resistance may occur. Further, operation (3) is preferably performed again after the ohmic layer is formed, which will be described. Accordingly, an ultra-small LED electrode assembly having improved emission efficiency can be embodied, and a luminance of the embodied LED display can be improved.

Meanwhile, the method of manufacturing an ultra-small LED electrode assembly provided in an LED display according to one exemplarily embodiment of the present invention may further include simultaneously forming an ohmic layer and contact portions of the first and second mounting electrodes and the ultra-small LED device after the above-described operation (2) is performed. The forming of the ohmic layer is preferably performed after the above-described operation (3) is performed.

Figure 13:
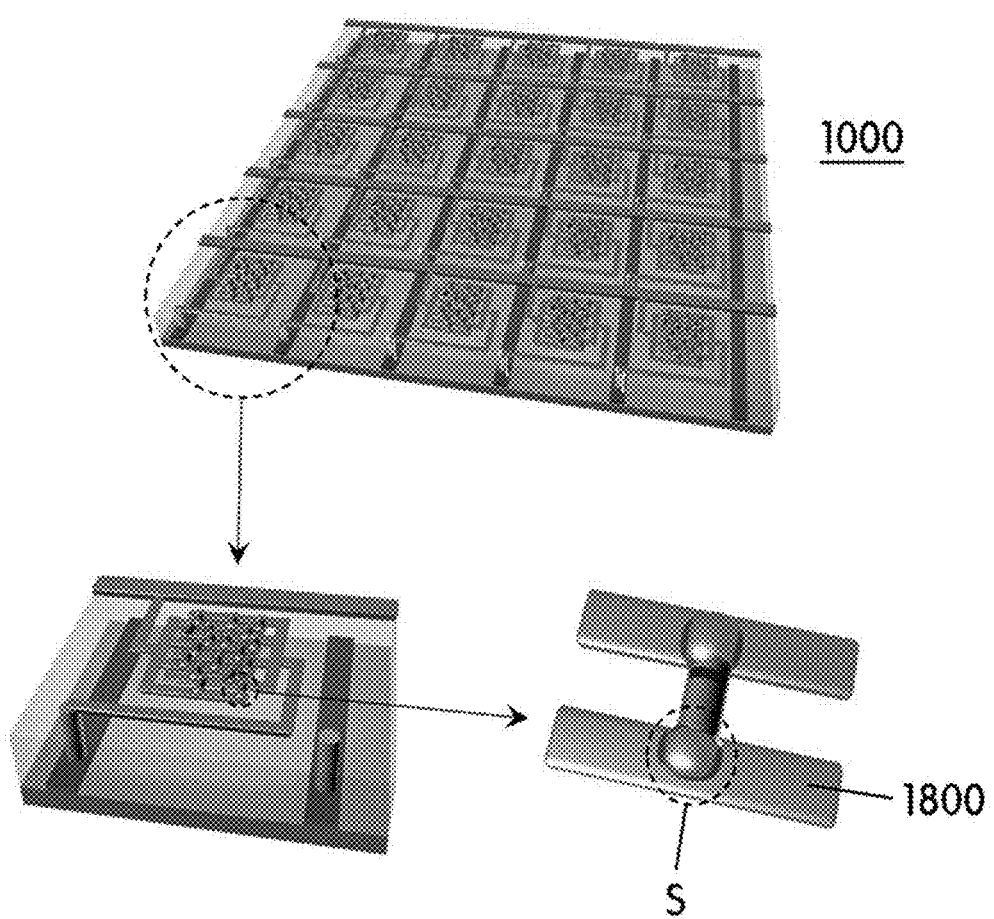
FIG. 13 is a view illustrating an ohmic layer formed in an ultra-small LED electrode assembly included in one embodiment of the present invention.

The reason for simultaneously forming an ohmic layer 1800 and a contact portion S, as shown in FIG. 13, is to further improve emission efficiency by reducing a contact resistance generated between the mounting electrodes and the ultra-small LED devices when driving power is applied thereto. Since the ohmic layer can be made using any known general methods in the art without limitation, the present invention is not limited to a specific method, and a description thereof will be omitted. Further, a known material, e.g., gold (Au), may be used as a material of the ohmic layer.

Meanwhile, in the full-color LED display according to the first embodiment of the present invention, ultra-small LED electrode assemblies provided in subpixels may emit blue light, white light, or UV light, and, in this case, a process of forming a color conversion layer, which is capable of converting emitted light into light having a light color different from a light color of the emitted light for implementing a color image, on the subpixels may be further performed on the full-color LED display.

Preferably, color reproducibility may be improved by further enhancing color purity, a short-wavelength transmission filter may be formed on the subpixel to improve emission efficiency of color converted light, e.g., green light or red light, of a front surface thereof so that light emission is changed from a rear surface of the color conversion layer to the front surface, and the color conversion layer may be formed in one region of an upper portion of the short-wavelength transmission filter.

Figure 9:
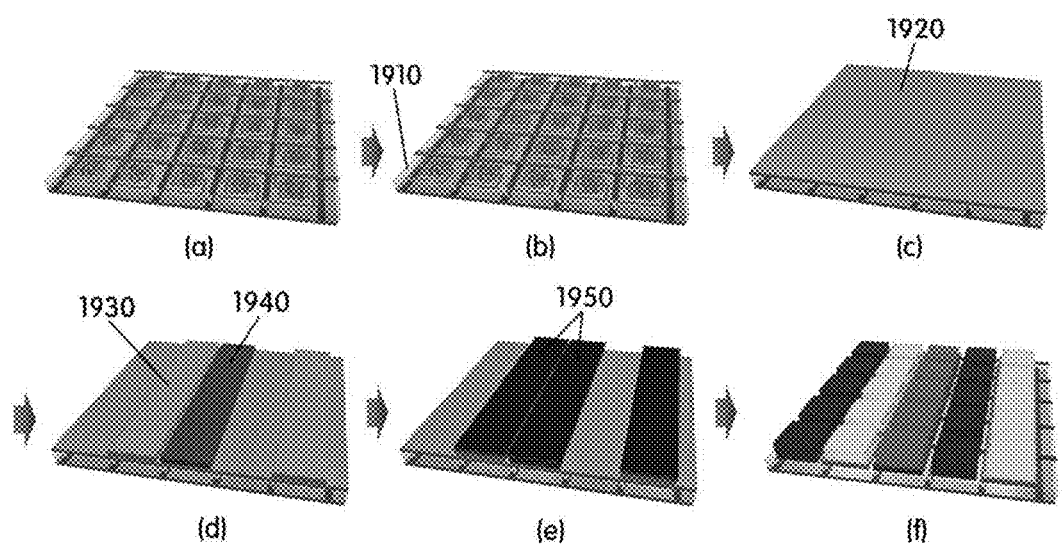
FIG. 9 is a schematic view illustrating a method of manufacturing a full-color LED display according to one embodiment of the present invention.

The above will be described on the basis of a display implemented with subpixels including ultra-small LED electrode assemblies which emit blue light. Specifically, a passivation layer 1910 is formed as shown in FIG. 9B to simultaneously planarize and insulate upper portions of subpixels on which a metal ohmic layer is formed, as shown in FIG. 9A, and then a short-wavelength transmission filter 1920 may be formed on the passivation layer 1910, as shown in FIG. 9C. The short-wavelength transmission filter 402 may be a multilayer film in which thin films made of highly refractive and slightly refractive materials are repeatedly formed, and a composition of the multilayer film may be $[(0.125)SiO_2/(0.25)TiO_2/(0125)SiO_2]_m$ (m=the number of repeated layers, and m is 5 or more) to transmit blue light and reflect light having a wavelength longer than the blue light. Further, the short-wavelength transmission filter 402 may have a thickness of 0.5 to 10 but is not limited thereto. A method of forming the short-wavelength transmission filter 1920 may be one method of an e-beam method, a sputtering method, and an atomic layer deposition (ALD) method, but is not limited thereto.

Next, a process of forming color conversion layers 1930 and 1940 may be performed on the short-wavelength transmission filter 1920, as shown in FIG. 9D. Specifically, the color conversion layers 1930 and 1940 may be formed by patterning a green color conversion layer 1930 on the short-wavelength transmission filter corresponding to some subpixels selected among the subpixels and patterning a red color conversion layer 1940 on the short-wavelength transmission filter corresponding to some subpixels selected among the remaining subpixels. A method of forming the patterns may be performed by one or more methods selected from the group of a screen printing method, a photolithography method, and a dispensing method. Meanwhile, a patterning order of the green color conversion layer and the red color conversion layer has no limitation, and the layers may be simultaneously formed or may be formed in a reversed order. Further, the red color conversion layer 1940 and the green color conversion layer 1930 may include a color conversion material such as a phosphor or the like which is excited by light emitted from a color conversion layer, e.g., a color filter, or ultra-small LED electrode assemblies known in light and display fields and converts the light into light having a desired light color, or may include a known color conversion material. For example, the green color conversion layer 1930 may be a phosphor layer including a green phosphor, and specifically, may include one or more phosphors selected from the group of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce,Li, β-SiALON:Eu, $CaSc_2O_4$:Ce, $Ca_3Sc_2Si_3O_{12}$:Ce, Caα-SiALON:Yb, Caα-SiALON:Eu, Liα-SiALON:Eu, $Ta_3Al_5O_{12}$:Ce, $Sr_2Si_5N_8$:Ce, (Ca, Sr,Ba)$Si_2O_2N_2$:Eu, $Ba_3Si_6O_{12}N_2$:Eu, γ-AlON:Mn, and γ-AlON:Mn,Mg, but is not limited thereto. Further, the red color conversion layer 1940 may be a phosphor layer including a red phosphor, and specifically, may include one or more phosphors selected from the group of $(Sr,Ca)AlSiN_3$:Eu, $CaAl SiN_3$:Eu, $(Sr,Ca)S$:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce, and $Sr_2Si_5N_8$:Eu, but is not limited thereto.

When an LED display substrate manufactured as shown in FIG. 9D is viewed from a vertical top thereof, only a short-wavelength transmission filter is disposed on the uppermost layer and a green color conversion layer and red color conversion layer are not formed at some subpixel sites, and thus blue light may be incident on the some subpixel sites. In addition, green light may be incident on some subpixel regions at which the green color conversion layer 1930 is formed on the short-wavelength transmission filter through the green conversion layer. Further, since the red color conversion layer 1940 is formed on the short-wavelength transmission filter at the remaining subpixel sites, red light may be incident on the remaining subpixel sites, and thus a color-by-blue LED display can be embodied.

A long-wavelength transmission filter 1950 may preferably be formed on an upper portion of the display substrate including the green and red color conversion layers 1930 and 1940, as shown in FIG. 9E.

An insulating layer (not shown) may preferably be formed on the short-wavelength transmission filter 1920 including the patterned color conversion layers 1930 and 1940 before the long-wavelength transmission filter 1950 is formed. Further, stepped portions are made because of steps between a portion on which the green or red color conversion layer is formed and a portion on which the green or red color conversion layer is not formed, as shown in FIG. 9D, but the stepped portions may be coated with and planarized by the insulating layer. The insulating layer may be formed of one material of spin-on-glass (SOG), a transparent polymer, and a transparent dielectric paste using a spin coating or screen printing method, but is not limited thereto. The formed insulating layer may have a thickness of 10 to 100 μm, but is not limited thereto.

Then, the long-wavelength transmission filter 1950 may be formed as shown in FIG. 9E to prevent degradation of color purity above the insulating layer by mixing blue light emitted from the ultra-small blue LEDs and green and red light emitted from the green and red color conversion layers. The long-wavelength transmission filter 1950 may be formed on all or a part of the green color conversion layer 1930 and the red color conversion layer 1940, and may preferably be formed on only the green and red color conversion layers. The long-wavelength transmission filter 1950 used herein may be a multilayer film in which thin films made of highly refractive and slightly refractive materials, which are capable of achieving the purpose of transmission of light having a long wavelength and reflection of light having a short wavelength to reflect blue light, are repeatedly formed, and a composition of the multilayer film may be $[(0.125)SiO_2/(0.25)TiO_2/(0125)SiO_2]_m$ (m=the number of repeated layers, and m is 5 or more). Further, the long-wavelength transmission filter 1950 may have a thickness of 0.5 to 10 but is not limited thereto. A method of forming the long-wavelength transmission filter 1950 may be one method of an e-beam method, a sputtering method, and an ALD method, but is not limited thereto. Further, in order to form the long wavelength transmission filter on only the green and red color conversion layers, the long wavelength transmission filter may be formed in a desired region using a metal mask capable of exposing the green and red color conversion layers and masking the other regions excluding the exposed areas.

The full-color LED display according to the first embodiment of the present invention which is embodied using the above-described manufacturing method has an improved orientation tendency between one specific end of the ultra-small LED device and a specific mounting electrode line. Therefore, the embodied full-color LED display includes subpixels, each of which includes at least one ultra-small LED electrode assembly configured to emit light having substantially the same light color, and the ultra-small LED electrode assembly includes mounting electrode lines including a first mounting electrode and a second mounting electrode which are formed on the same plane and spaced apart from each other, ultra-small LED devices including a first semiconductor layer and a second semiconductor layer, which each have one end in contact with the first mounting electrode and the other end in contact with the second mounting electrode, wherein a percentage of the ultra-small LED devices, of which the first semiconductor layer is in direct or indirect contact with the first mounting electrode, among all of the ultra-small LED devices in contact with the mounting electrode is satisfied as 60% or more.

Figure 10A:
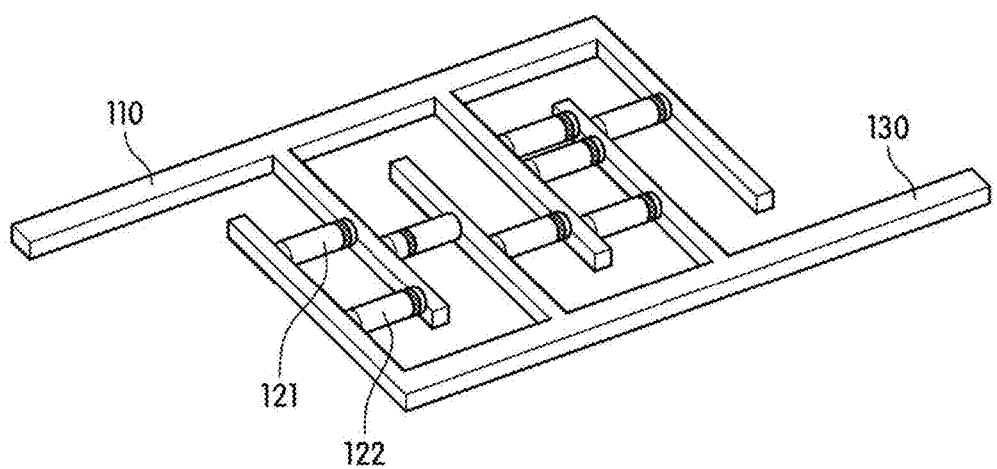

Specifically, FIG. 10A is a schematic view illustrating one ultra-small LED electrode assembly provided in a subpixel, wherein the ultra-small LED electrode assembly is embodied to include electrode lines including a first mounting electrode 110 and a second mounting electrode 130, which are formed on the same plane and spaced apart from each other, and a plurality of ultra-small LED devices 121 and 122, which each have one end in contact with the first mounting electrode and the other end in contact with the second mounting electrode.

In an ultra-small LED electrode assembly such as that shown in FIG. 10A, since the first mounting electrode 110 and the second mounting electrode 130 are located on the same plane, the ultra-small LED devices 121 and 122 are connected to the electrodes while in lying postures, and since nanometer-sized ultra-small LED devices need not be three-dimensionally upright to be coupled to the electrodes, the number of devices electrically connected to the electrodes are increased. Further, since an amount of photons generated inside the ultra-small LED device, which are blocked by electrodes, not extracted, and dissipated, is minimized, light extraction efficiency of the ultra-small LED device can be improved, and an LED display having an improved luminance can be suitably embodied.

Figure 11:
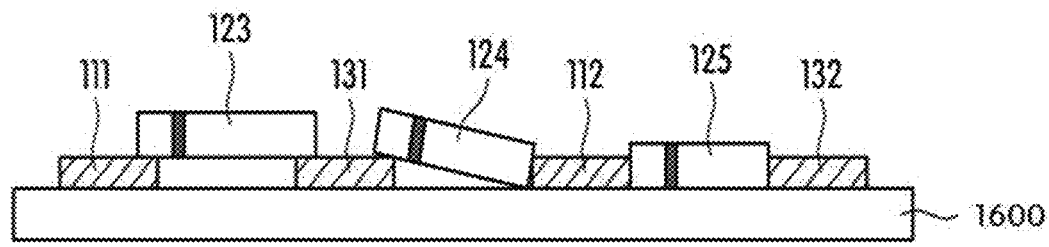
FIG. 11 is a schematic view illustrating various shapes in which mounting electrodes are in contact with both end portions of each ultra-small LED device in an ultra-small LED electrode assembly included in one embodiment of the present invention.

Although both of the end portions of each of the ultra-small LED devices 121 and 122 are in contact with two the mounting electrodes 110 and 130 in FIG. 10A, both of the end portions of each of the ultra-small LED device may be variously in contact with two mounting electrodes, as shown in FIG. 11. Specifically, a first ultra-small LED device 123 is mounted so that both end portions thereof are in contact with upper portions of a first mounting electrode 111 and a second mounting electrode 131, one end portion of a second ultra-small LED device 124 is in contact with an upper portion of the second mounting electrode 131 and the other end portion thereof is in contact with a side surface of another first mounting electrode 112. Further, both end portions of a third ultra-small LED device 125 are in contact with side surfaces of the other first mounting electrode 112 and another second mounting electrode 132. As shown in FIG. 11, in the ultra-small LED electrode assembly included in one embodiment of the present invention, one ultra-small LED electrode assembly may have various contact forms in which an ultra-small LED device is inserted into a separate space between two mounting electrodes and is in contact with the two mounting electrodes or in which the ultra-small LED device is in contact with upper portions of the two mounting electrodes. Alternatively, a multilayer may be formed in the separate space between the two mounting electrodes and the ultra-small LED device may be inserted into the multilayer to come into contact with the two mounting electrodes. Therefore, the contact forms are not limited to those shown in FIG. 11.

Meanwhile, since the ultra-small LED device mounted in one ultra-small LED electrode assembly included in the present invention is embodied so that about 60% or more of all of the mounted ultra-small LED devices have an orientation tendency of the same semiconductors, e.g., the first semiconductor layers, coming into contact with one electrode, e.g., the first mounting electrode, even when AC power is not used as driving power and DC power is used as the driving power, 60% or more of all of the mounted ultra-small LED devices may emit light, and thus sufficient luminance characteristics can be exhibited. When less than 60% of all of the mounted ultra-small LED devices have a unidirectional orientation, a luminance exhibited when DC power is used as the driving power is significantly degraded in comparison with a luminance exhibited when AC power is used as the driving power, and thus driving the LED display by using DC driving power is difficult. A percentage of the ultra-small LED devices which each have the first semiconductor layer in direct or indirect contact with the first mounting electrode among all of the mounted ultra-small LED devices in one ultra-small LED electrode assembly may preferably be 80% or more, and thus more improved luminance characteristics can be exhibited.

Further, in the ultra-small LED electrode assembly provided in the LED display according to one embodiment of the present invention, the number of mounted ultra-small LED devices per unit area ($mm^2$) is 1,000 or more, and thus a display having very excellent luminance characteristics can be embodied. Meanwhile, an average number of mounted ultra-small LED devices per unit area is not related to a total area including electrode regions in which the ultra-small LED devices are not substantially mounted, and refers to the number of mounted ultra-small LED devices per unit area which is converted from the number of mounted ultra-small LED devices on the basis of an area of mounting electrode lines on which the ultra-small LED devices are substantially mounted.

Meanwhile, any ultra-small LED device generally used in an LED display may be used for the ultra-small LED device provided in the ultra-small LED electrode assembly without limitation. A length of the ultra-small LED device may preferably be in the range of 100 nm to 10 µm, and may more preferably be in the range of 500 nm to 5 µm. When the length of the ultra-small LED device is less than 100 nm, manufacturing an LED device having high efficiency may be difficult, and when the length is greater than 10 µm, light emission efficiency of the LED device may be degraded. The ultra-small LED device may have various shapes, such as a cylindrical shape, a rectangular shape, etc., and may preferably have a cylindrical shape, but the shape is not limited to the above-described shapes. Further, an aspect ratio of the ultra-small LED device may be in the range of 1.2 to 100, preferably in the range of 1.2 to 50, more preferably in the range of 1.5 to 20, and especially preferably in the range of 1.5 to 10. When the aspect ratio of the ultra-small LED device is less than 1.2, the ultra-small LED devices may not be self-aligned even when power is applied to electrode lines, and when the aspect ratio is more than 100, a voltage of power for self-aligning the ultra-small LED devices may be low, but a process of manufacturing a device having an aspect ratio of more than 100 may be difficult due to process limitations during a process of manufacturing the ultra-small LED devices using a dry etching process and the like.

Further, the ultra-small LED device may include a first semiconductor layer and a second semiconductor layer, and more preferably, may include the first semiconductor layer, an active layer formed on the first semiconductor layer, the second semiconductor layer formed on the active layer, and an insulating thin film configured to cover at least an entire outer surface of the active layer among outer surfaces of the ultra-small LED device.

Here, one semiconductor layer among the first semiconductor layer and the second semiconductor layer may include at least one N-type semiconductor layer, and the other semiconductor layer may include at least one P-type semiconductor layer. For example, when an ultra-small LED device is a blue light emission device, the N-type semiconductor layer may be one or more selected from InAlGaN, GaN, AlGaN, InGaN, AlN, InN, and the like, which are semiconductor materials having a compositional formula of $In_xAl_yGa_{1-x-y}N$ (0≤x≤1, 0≤y≤1, and 0≤(x+y)≤1), and may be doped with a first conductive dopant such as Si, Ge, Sn, etc. The N-type semiconductor layer may preferably have a thickness of 500 nm to 5 μm, but is not limited thereto. Emitted light of the ultra-small LED is not limited to blue light, and thus, in the case of different emitted light colors, there is no limitation in using a different type of III-V group semiconductor material in the N-type semiconductor layer. Further, the P-type semiconductor layer may be one or more selected from InAlGaN, GaN, AlGaN, InGaN, AN, InN, and the like, which are semiconductor materials having a compositional formula of $In_xAl_yGa_{1-x-y}N$ (0≤x≤1, 0≤y≤1, and 0≤(x+y)≤1), and may be doped with a second conductive dopant such as Mg. The P-type semiconductor layer may preferably have a thickness of 500 nm to 5 μm, but is not limited thereto. Emitted light of the ultra-small LED is not limited to blue light, and thus, in the case of different emitted light colors, there is no limitation in using a different type of III-V group semiconductor material in the P-type semiconductor layer.

The active layer may be interposed between the first semiconductor layer and the second semiconductor layer and, when an electric field is applied to a device, the active layer generates light because electrons are coupled to holes. The active layer may be formed with one or multiple quantum well structures. Clad layers doped with a conductive dopant may be formed on and/or under the active layer, and the clad layers doped with the conductive dopant may be embodied as an AlGaN layer or InAlGaN layer. Alternatively, a material, such as AlGaN, AlInGaN, or the like, may also be used as the active layer. The active layer may preferably have a thickness of 10 to 200 nm, but is not limited thereto. The active layer may be formed to be located at any location according to types of LEDs. A light color of the ultra-small LED device is not limited to blue, and thus, in the case of different emitted light colors, there is no limitation in using a different type of III-V group semiconductor material in the active layer.

Electrode layers may be further formed on the first semiconductor layer and/or under the second semiconductor layer. When the semiconductor layer further includes the electrode layer, a contact of a mounting electrode and an ultra-small LED device may be formed between the electrode layer and the mounting electrode and/or between both the electrode and semiconductor layers and the mounting electrode. The electrode layer may be formed of a metal or metal oxide generally used for an electrode of an LED device, and may preferably be formed of one or a combination of chrome (Cr), titanium (Ti), aluminum (Al), gold (Au), nickel (Ni), indium tin oxide (ITO), and an oxide or alloy thereof, but the present invention is not limited thereto. The electrode layer may preferably have a thickness of 1 to 100 nm, but is not limited thereto. When the semiconductor layer includes the electrode layer, the electrode layer and the mounting electrode may be joined at a temperature lower than a temperature required in a process of forming a metal ohmic layer on a contact portion of the semiconductor layer and the mounting electrode.

At least an outer surface of the ultra-small LED device and the active layer may be coated with the insulating thin film, and more preferably, one or more of the first semiconductor layer and the second semiconductor layer may be coated with the insulating thin film, to prevent durability of the ultra-small LED device from being degraded due to damage of an outer surface of the semiconductor layer. The insulating thin film may serve to prevent electrical short circuits generated in the ultra-small LED device when the active layer included in the ultra-small LED device comes into contact with the mounting electrode. Further, the insulating thin film protects the outer surface of the ultra-small LED device and the active layer, and thus surface defects of the active layer are prevented and a decrease in emission efficiency can be prevented. The insulating thin film may preferably include one or more of silicon nitride ($Si_3N_4$), aluminum oxide ($Al_2O_3$), hafnium oxide ($HfO_2$), yttrium oxide ($Y_2O_3$), and titanium dioxide ($TiO_2$), and more preferably, may include transparent materials of the above components, but the present invention is not limited thereto. A transparent insulating thin film may serve as the insulating thin film, and a decrease in emission efficiency which may occur may also be minimized by using the ultra-small LED device coated with the insulating thin film.

Further, since the ultra-small LED electrode assembly provided in the full-color LED display according to the above-described first embodiment has an improved orientation tendency between one specific end of the ultra-small LED device and a specific mounting electrode line, one ultra-small LED electrode assembly provided in each subpixel may have a satisfied luminance gain of 1.1 or more according to the following Equation 2, and may preferably have a satisfied luminance gain of 1.3 or more.

$$\text{Luminance Gain} = \frac{\text{Luminance of ultra-small } LED \text{ electrode assembly driven by DC voltage (cd/m}^2\text{)}}{\text{Luminance of ultra-small } LED \text{ electrode assembly driven by AC voltage (cd/m}^2\text{)}} \quad \text{[Equation 2]}$$

Equation 2 shows a parameter for a relative ratio with respect to luminance measured in an ultra-small LED electrode assembly when DC power and AC power are applied to the same single ultra-small LED electrode assembly as driving power and a magnitude of a DC voltage (V) is 0.5 times amplitude of an AC voltage (V). As the luminance gain has a value greater than one, the DC power may drive the ultra-small LED electrode assembly as the driving power, improved luminance characteristics may also be exhibited, and a luminance exhibited by each subpixel may also be more uniform.

Specifically, the following Comparative Example 1 relates to an ultra-small LED electrode assembly manufactured using a conventional manufacturing method. An area of a graph measured for each wavelength when DC power having a waveform of 21.2 V without a cycle was applied to the ultra-small LED electrode assembly as driving power was merely 0.51 times an area of a graph measured for each wavelength when AC power having a peak voltage of ±21.2 V and in a sine wave form having a frequency of 60 Hz was applied thereto as the driving power. Regarding intensity of light maximally emitted by the ultra-small LED electrode assembly, the intensity of light when the DC power was applied to the ultra-small LED electrode assembly as the driving power was merely about 0.52 times the intensity of light when the AC power was applied thereto as the driving power. Therefore, the luminance and the intensity of the light in a specific wavelength band were significantly degraded (see Table 1).

Compared to the above, in the case of an ultra-small LED electrode assembly manufactured using one embodiment of the present invention (see Example 2), an area of a graph measured for each wavelength when DC power having a waveform of 21.2 V without a cycle was applied to the ultra-small LED electrode assembly as driving power was significantly increased to be 1.12 times an area of a graph measured for each wavelength when AC power having a peak voltage of ±21.2 V and in a sine wave form having a frequency of 60 Hz was applied thereto as the driving power. Regarding intensity of light maximally emitted by the ultra-small LED electrode assembly, the intensity of the light when the DC power was applied to the ultra-small LED electrode assembly as the driving power was significantly increased to be about 1.19 times the intensity of light when the AC power was applied thereto as the driving power.

Further, in the case of an ultra-small LED electrode assembly manufactured using another embodiment of the present invention (see Example 1), an area of a graph measured for each wavelength when DC power having a waveform of 21.2 V without a cycle was applied to the ultra-small LED electrode assembly as driving power was significantly increased to be 1.43 times an area of a graph measured for each wavelength when the AC power having a peak voltage of ±21.2 V and in a sine wave form having a frequency of 60 Hz was applied thereto as the driving power. Regarding intensity of light maximally emitted by the ultra-small LED electrode assembly, the intensity of the light when the DC power was applied to the ultra-small LED electrode assembly as the driving power was significantly increased to be about 1.47 times the intensity of light when the AC power was applied thereto as the driving power.

Meanwhile, a full-color LED display according to a second embodiment of the present invention is manufactured using the following manufacturing method so that a full-color image is embodied without including color conversion layers, unlike the first embodiment.

Specifically, the method includes forming subpixels, each of which includes at least one ultra-small LED electrode assembly configured to emit light having substantially the same light color, wherein the light color is divided into a plurality of different light color groups including a first light color, a second light color, and a third light color. The ultra-small LED electrode assembly may be manufactured by (a) introducing a solution including ultra-small LED devices to a mounting electrode line including a first mounting electrode and a second mounted, which is an electrode formed on the same plane as the first mounting electrode and spaced apart from the first mounting electrode, and (b) self-mounting the plurality of ultra-small LED devices by applying power, which has an asymmetric assembly voltage of 10 V or more according to Equation 1, to the mounting electrode line such that one end of each of the ultra-small LED devices comes into contact with the first mounting electrode and the other end thereof comes into contact with the second mounting electrode.

There is a difference between color implementation methods of the full-color LED display according to the second embodiment and the full-color LED display according to the first embodiment, and specifically, the subpixels are embodied so that light color is divided into the plurality of different light color groups including the first light color, the second light color, and the third light color. Each of the subpixels may include one or more ultra-small LED electrode assemblies, each of which exhibits one light color among the first light color, the second light color, and the third light color.

Figure 14A:
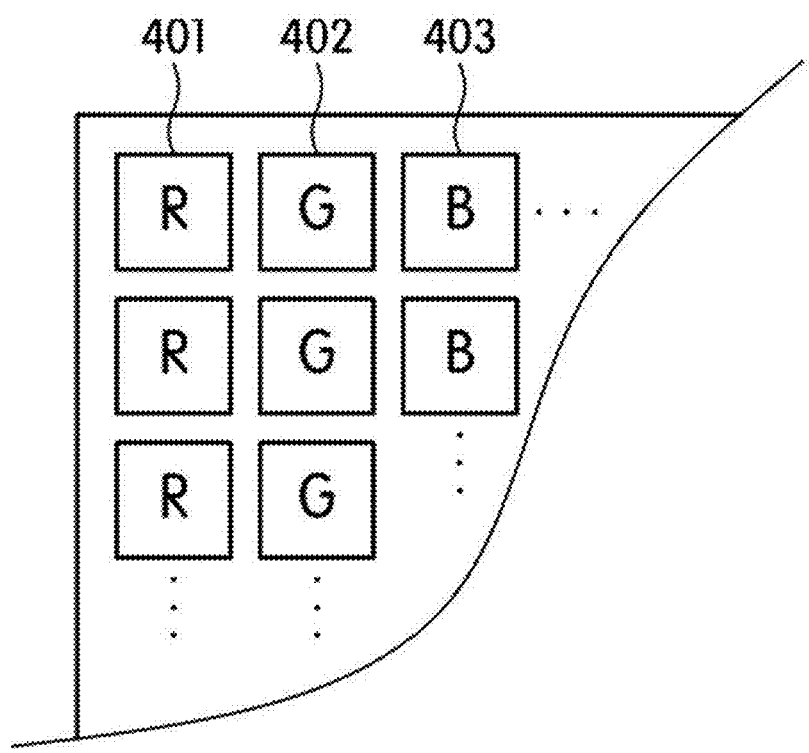
Figure 14B:
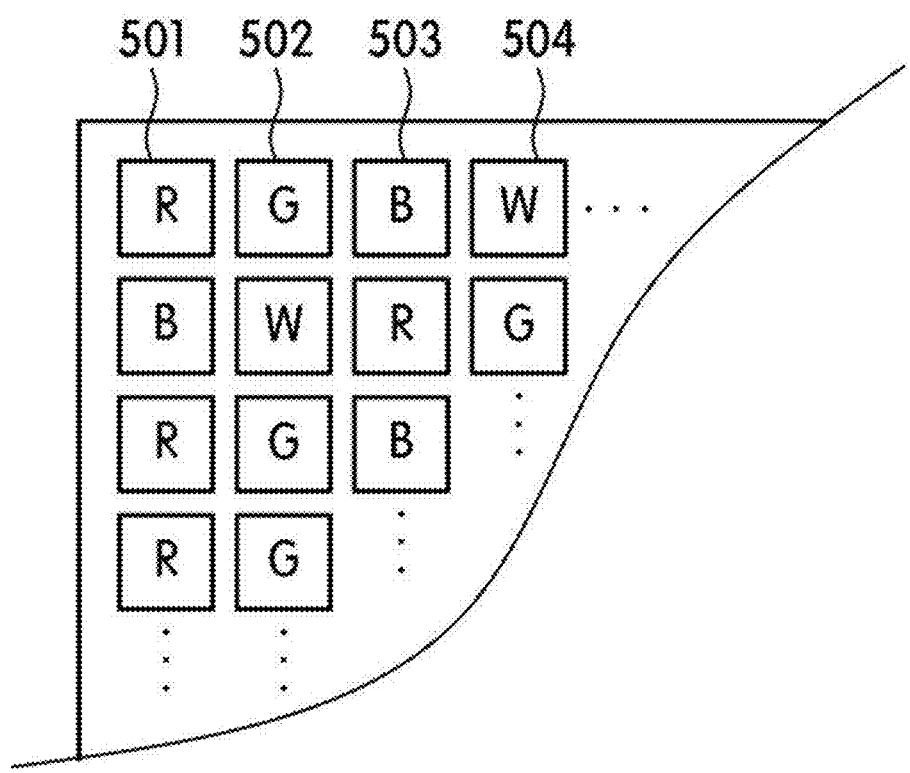

As an example of the first light color, the second light color, and the third light color, the first light color may be blue 403, the second light color may be green 402, and the third light color may be red 401, as shown in FIG. 14A, and thus an R-G-B LED display can be embodied. Alternatively, the light color group may further include a fourth light color group which has a light color of white 504, as shown in FIG. 14B, thus an R-G-B-W LED display can be embodied, and thereby an LED display having more improved color reproducibility can be embodied.

The method of manufacturing of a full-color LED display according to the second embodiment may have substantially the same applied asymmetric voltage conditions as the manufacturing method according to the above-described first embodiment.

However, the above methods may have a difference in that ultra-small LED electrode assemblies provided in adjacent subpixels are made to emit light having different light colors. For example, first subpixels 403 and 503 configured to emit blue light may be embodied with an ultra-small LED electrode assembly configured to emit blue light, wherein the ultra-small LED electrode assembly may be manufactured by introducing a solution including ultra-small blue LED devices to a mounting electrode line. Further, second subpixels 401 and 501 configured to emit red light may be embodied with an ultra-small LED electrode assembly configured to emit red light, wherein the ultra-small LED electrode assembly may be manufactured by introducing a solution including ultra-small red LED devices to another mounting electrode line. Here, solutions including ultra-small LED devices having different colors may be introduced to the mounting electrode lines provided in corresponding subpixels according to a sequence of colors or may be simultaneously introduced to the mounting electrode lines provided in the corresponding subpixels without the sequence of colors, that is, the present invention is not limited to the order of injection and production.

In the full-color LED display according to the above-described second embodiment, the ultra-small LED electrode assembly provided in the subpixel may have a luminance gain of 1.1 or more according to the above-described Equation 2, and may preferably have a luminance gain of 1.3 or more, which is the same as that of the full-color LED display according to the above-described first embodiment. Further, a percentage of ultra-small LED devices which have the first semiconductor layer in direct or indirect contact with the first mounting electrode among all of the ultra-small LED devices in contact with the mounting electrode may be 60% or more, and may preferably be 80% or more.

The present invention will be described in detail with the following examples, however, the scope of the present invention is not limited to the following examples, and it should be understood that the following examples are intended to assist the understanding of the present invention.

Example 1

The electrode lines shown in FIGS. 2A, 3A, and 4A were formed on a base substrate formed of a quartz material and having a thickness of 800 µm. Here, in the electrode lines, the first mounting electrode had a width of 3 µm, the second mounting electrode had a width of 3 µm, a distance between the first mounting electrode and the second mounting electrode adjacent thereto was 2.2 µm, the mounting electrode had a thickness of 0.2 µm, materials of the first mounting electrode and the second mounting electrode were gold, and an area of a region in which the ultra-small LED devices were mounted on the mounting electrode line was 4.2×10$^7$ µm$^2$. Then, an insulating layer made of silicon dioxide was formed in a separate space between lower portions of the mounting electrode lines on the base substrate. Then, an insulating partition wall made of silicon dioxide and surrounding the mounting electrode line was formed, and the insulating partition wall had a height of 0.1 µm from an upper portion of the insulating layer to an upper end of the insulating partition wall.

Subsequently, 0.7 weight % of ultra-small LED devices having a structure shown in Table 1 was mixed with 100 weight % of acetone, and thus a solution including the ultra-small LED devices was prepared.

Figure 15:
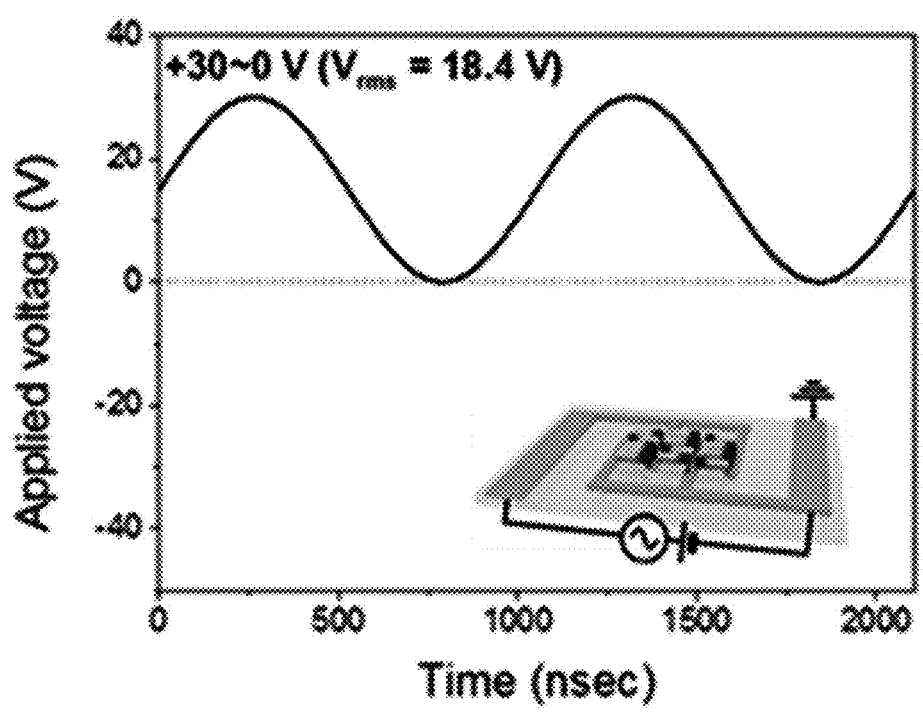
FIG. 15 is a graph illustrating assembly power applied to an ultra-small LED electrode assembly provided in one embodiment of the present invention when the ultra-small LED electrode assembly is embodied.

Then, 9 µl of the solution was dropped onto the electrode line 8 times, and then sine wave power having a voltage of 0 to +30 V and a frequency of 950 kHz, which is shown in FIG. 15, was applied to the mounting electrode as assembly power to move and arrange the ultra-small LED devices to be self-mounted.

Then, a thermal process was performed to improve a contact of the ultra-small LED device and the electrode line. The thermal process was performed in a nitrogen atmosphere at a pressure of 5.0×10$^{-1}$ torr and a temperature of 810° C. for two minutes. Subsequently, an electroless plating process was performed twice using a 0.05 mM gold aqueous solution and a copper metal foil at room temperature for 10 minutes. Once again, a thermal process was performed on gold nano particles, which were interposed between the electrode line and the ultra-small LED device using the electroless plating process, under the above conditions of the thermal process to improve electrical contactability of the gold nano particles so that an LED display including an ultra-small LED electrode assembly described in the following Table 2 was manufactured.

TABLE 1

|  | Material | Length (µm) | Diameter (µm) |
|---|---|---|---|
| First electrode layer | Chrome | 0.03 | 0.5 |
| First semi-conductor layer | N-GaN | 2.14 | 0.5 |
| Active layer | InGaN | 0.1 | 0.5 |
| Second semi-conductor layer | P-GaN | 0.2 | 0.5 |
| Second electrode layer | Chrome | 0.03 | 0.5 |
| Insulating thin film | Aluminum oxide |  | Thickness 0.02 |
| Ultra-small LED device | — | 2.5 | 0.52 |

Examples 2 and 3

Examples 2 and 3 were manufactured using the same method as Examples 1, and LED displays including an ultra-small LED electrode assembly shown in the following Table 2 were manufactured by self-aligning ultra-small LED devices by applying sine wave powers having voltages and cycles shown in the following Table 2, which were assembly powers applied to mounting electrodes, to the mounting electrodes.

Comparative Examples 1 to 3

Comparative Examples 1 to 3 were manufactured using the same method as Embodiment 1, and LED displays including an ultra-small LED electrode assembly shown in the following Table 2 were manufactured by self-aligning ultra-small LED devices by applying sine wave AC power having a voltage of −30 to +30 V and a frequency of 950 kHz (Comparative Example 1), sine wave power having a voltage of 0 to +8 V and a frequency of 950 kHz (Comparative Example 2), and sine wave AC power having a voltage of −22 V to +30 V and a frequency of 950 kHz (Comparative Example 3), which were assembly powers applied to mounting electrodes, to the mounting electrodes.

Experimental Example 1

The following physical properties of one ultra-small LED electrode assembly provided in each of the LED displays manufactured as Examples 1 to 3 and Comparative Examples 1 to 3 were measured, and the results are shown in the following Table 2.

1. Measurement of the Total Number of Ultra-Small LED Devices Mounted in the Ultra-Small LED Electrode Assembly A picture of the ultra-small LED electrode assembly was captured using an optical microscope, and the number of the ultra-small LED devices having both end portions in contact with different two electrodes was counted.

2. The Number and Percentage of the Ultra-Small LED Devices Mounted to have a Unidirectional Orientation The number of the ultra-small LED devices which emitted light due to the ultra-small LED electrode assembly being driven with DC power having a waveform of +21.2 V without a cycle was counted to measure the number of the mounted ultra-small LED devices having the first semiconductor layer of the ultra-small LED device in contact with the first mounting electrode among all of the mounted ultra-small LED devices. The counted number of light emitting ultra-small LED devices was calculated as a percentage based on all of the mounted ultra-small LED devices counted as a result of the first physical property evaluation.

3. Visual Evaluation of Light Emitting Intensity

Figure 10B:
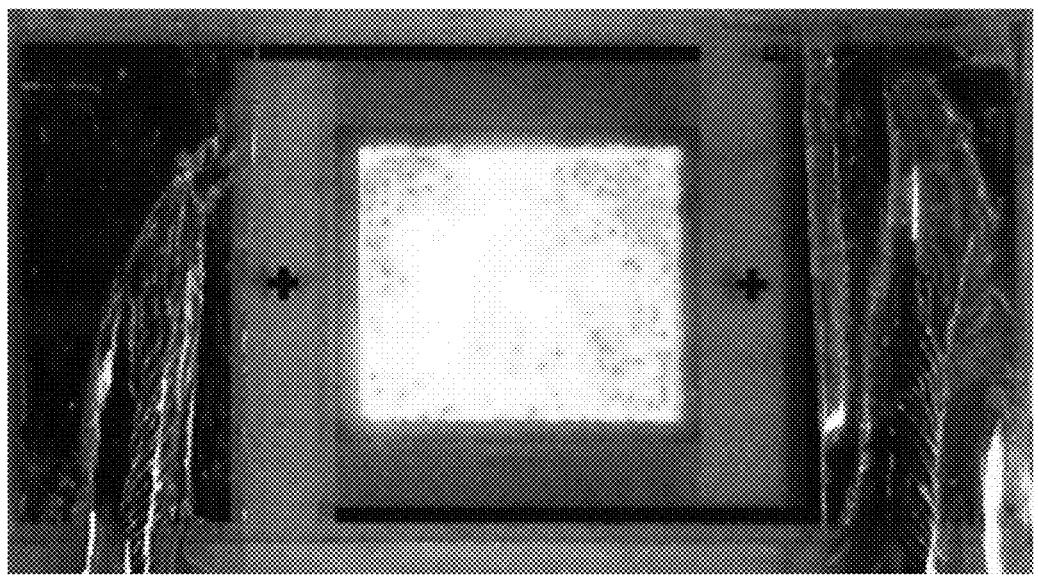
Figure 10C:
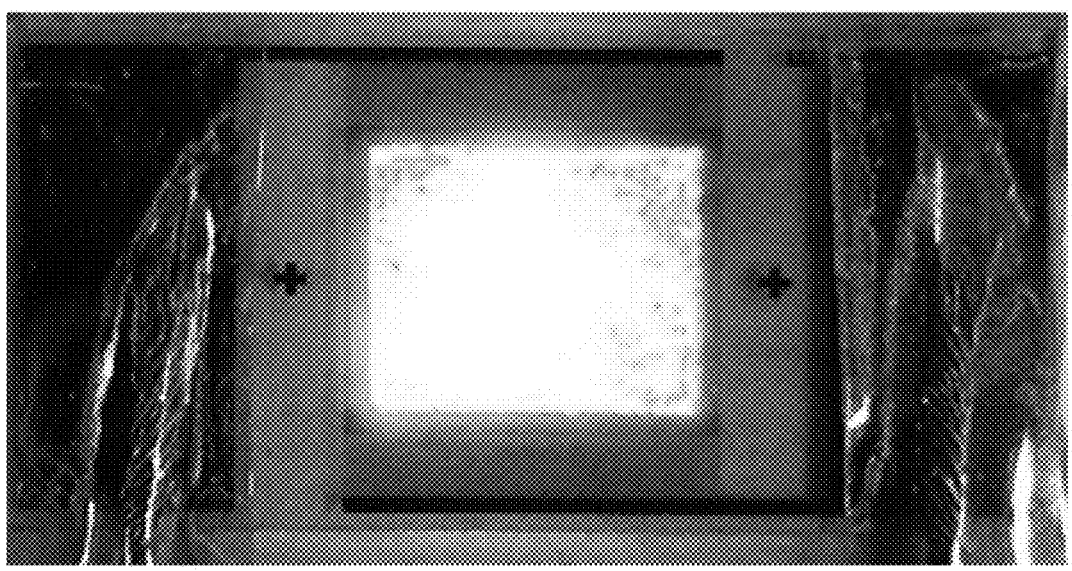
Figure 12A:
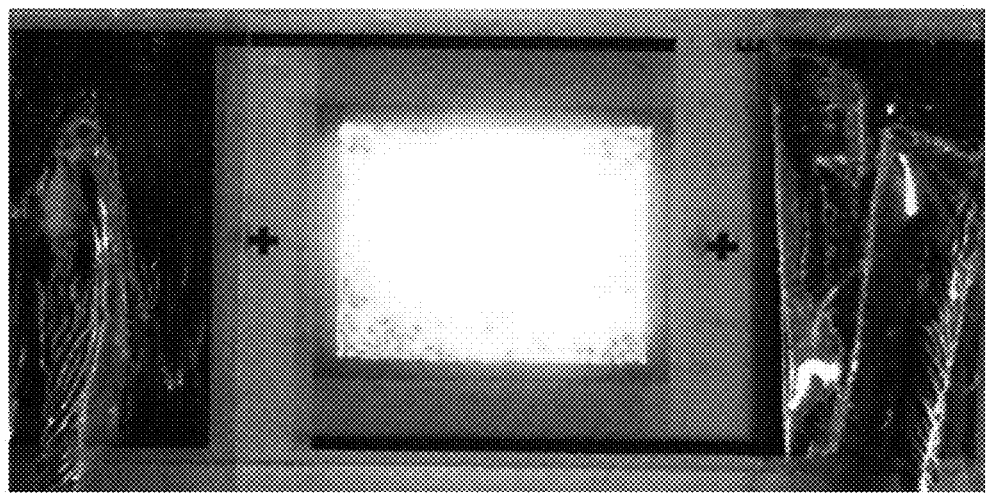
Figure 12B:
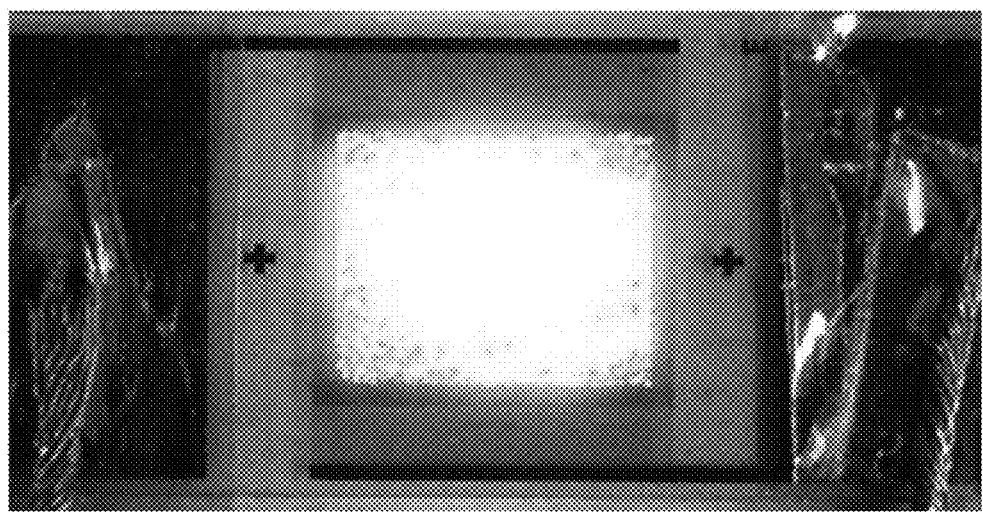

In order to drive the ultra-small LED electrode assembly, a light emission picture was captured by applying sine wave AC power having an effective voltage of 21.2 Vrms and a frequency of 60 Hz to the ultra-small LED electrode assembly as a first step, and a light emission picture was captured by applying DC power having a waveform of 21.2 V without a cycle to the ultra-small LED electrode assembly as a second step. According to the captured results, a light emission picture of Example 1 in the first step is shown in FIG. 10B, and a light emission picture of Example 1 in the second step is shown in FIG. 10C. Further, a light emission picture of Example 2 in the first step is shown in FIG. 12A, and a light emission picture of Example 2 in the second step is shown in FIG. 12B. In addition, a light emission picture of Comparative Example 1 in the first step is shown in FIG. 7B, and a light emission picture of Comparative Example 1 in the second step is shown in FIG. 7C.

Specifically, when the light emission pictures are visually inspected, in the case of Examples 1 and 2, degrees of emission in the first step (AC power) and the second step (DC power) were similar, or the degrees of emission in the second step were slightly greater than those in the first step. However, in the case of Comparative Example 1, emission in the first step (AC power) had a much higher degree than that in the second step (DC power), and a luminance in the second step (DC power) was visually determined as very low.

4. Measurement of Luminance and Peak Intensity

In order to drive the ultra-small LED electrode assembly, a luminance and peak intensity thereof were measured using a spectrophotometer by applying sine wave AC power having an effective voltage of 21.2 Vrms and a frequency of 60 Hz to each of the ultra-small LED electrode assembly as a first step, and a luminance and peak intensity were measured using the spectrophotometer by applying DC power having a waveform of 21.2 V without a cycle to each of the ultra-small LED electrode assembly as a second step. A value of an area (sum %) in an electric field light emission spectrum and an intensity proportion (peak %) of light having maximum intensity were calculated for each of Examples 1 to 3 and Comparative Examples 1 to 3. Here, the value of the area and the intensity proportion in the second step of each of Examples 1 to 3 and Comparative Examples 1 to 3 are relatively shown on the basis of the value of the area and the intensity proportion in the first step thereof.

Further, in the case of the ultra-small LED electrode assembly provided in the LED display according to Comparative Example 2 (the asymmetric assembly power according to Equation 1 was 8 V), the intensity of emitted light based on a total wavelength when DC power was used as driving power was 0.81 times the intensity of light when AC power was used and was improved by about 59% of Comparative Example 1, but the number of mounted ultra-small LED device was significantly low, and thus a significant decrease of luminance thereof can be predicted. Furthermore, even when the intensity of the emitted light of Comparative Example 2 based on the total wavelength when the DC power was used as the driving power was improved from that of Comparative Example 1, the intensity of the light was still significantly low compared to that of Examples 1 to 3.

Further, in the ultra-small LED electrode assembly provided in the LED display according to Comparative Example 3, an asymmetric voltage value according to Equation 1 of an applied assembly power was 8 V, which was identical to that of Comparative Example 2, but an effective

TABLE 2

| | | Example 1 | Example 2 | Example 3 | Comparative Example 1 | Comparative Example 2 | Comparative Example 3 |
|---|---|---|---|---|---|---|---|
| Ultra-small LED electrode assembly | Applying power for self-aligning (assembly power) | 0 V to 30 V 950 kHz | 0 V to 13 V 950 kHz | +30 V to −10 V 950 kHz | −30 V to +30 V 950 kHz | 0 V to 8 V 950 kHz | +30 V to −22 V 950 kHz |
| | Asymmetric assembly voltage (V) of Equation 1 | 30 | 13 | 20 | 0 | 8 | 8 |
| | Effective voltage (Vrms, V) of assembly power | 18.4 | 8.0 | 17.3 | 21.2 | 4.9 | 18.8 |
| | Total number of mounted ultra-small LED devices | 88,150 | 59,011 | 71.185 | 166,517 | 20,615 | 90,891 |
| | Number of unidirectionally oriented ultra-smal LED device | 78,910 | 36,189 | 57,161 | 81,005 | 9,615 | 44,446 |
| | Percentage of unidirectionally oriented ultra-small LED device (%) | 89.5 | 61.3 | 80.3 | 48.6 | 46.6 | 48.9 |
| First step (AC power) | sum % | 1.0 | 1.0 | 1.0 | 1.0 | 1.0 | 1.0 |
| | peak % | 1.0 | 1.0 | 1.0 | 1.0 | 1.0 | 1.0 |
| Second step (DC power) | sum % | 1.43 | 1.12 | 1.31 | 0.51 | 0.81 | 0.97 |
| | peak % | 1.47 | 1.19 | 1.34 | 0.52 | 0.83 | 0.99 |

As shown in Table 2, in the ultra-small LED electrode assembly provided in the LED display according to Comparative Example 1, the intensity of emitted light based on a total wavelength when DC power was used as the driving power was merely 0.51 times the intensity of light when AC power was used, and the peak intensity (peak %) when the DC power was used was merely 0.52 times the peak intensity when AC power was used.

voltage of the applied assembly power was 18.8 V, which was significantly increased from a magnitude of that of Comparative Example 2, and thus the number of mounted devices was significantly increased. However, in Comparative Example 3, a luminance when DC driving power was used was also lower than the luminance when AC driving power was used, and thus the AC power was determined to be more suitable as the driving power.

However, in the case of Examples 1 and 2, a luminance when DC power was used as driving power was much higher than a luminance when AC power was used as the driving power and, in the case of Example 1, the luminance when the DC driving power was used was increased to be 1.43 times the luminance when the AC driving power was used, and the peak intensity when the DC driving power was used was increased to be 1.47 times the peak intensity when the AC driving power was used.

According to the present invention, the amount of photons which are generated by ultra-small LED devices, blocked by vertically disposed electrode lines of a display, and not extracted can be minimize, the ultra-small LED device can be connected to ultra-small electrodes without defects such as electrical short circuits and the like, and thus the display can exhibit excellent luminance. Further, since selection of driving power of ultra-small LED electrode assemblies has no limit, the display can exhibit a sufficient luminance characteristic using DC driving power and, in addition, the luminance characteristic can be further improved by the DC driving power. Furthermore, when a DC driving voltage is used, each pixel can exhibit uniform luminance, and thus uniform luminance characteristics and color reproducibility can be exhibited by the entire display. In addition, since intensity of light corresponding to a specific wavelength included in an LED itself is further improved, when a light color is converted into a light color of light in a different wavelength to implement full-color, intensity of the light having the converted light color is significantly increased, and thus the display can be embodied to have more improved color reproducibility.

While the present invention has been described with reference to exemplary embodiments thereof, it should be understood that the scope of the present invention is not limited to the disclosed exemplary embodiments, and those skilled in the art should understand that the scope of the present invention may easily suggest other embodiments through the addition, modification, or deletion of components without departing from the spirit and scope of the present invention.

What is claimed is:

1. A full-color light emitting diode display having an improved luminance, comprising a plurality of subpixels, each of the plurality of subpixels comprises at least one ultra-small LED electrode assembly configured to emit light having substantially the same light color, wherein
the ultra-small LED electrode assembly comprises a mounting electrode line including a first mounting electrode and a second mounting electrode, wherein the first mounting electrode and the second mounting electrode are formed on the same plane and spaced apart from each other; and a plurality of ultra-small LED devices, wherein each of the plurality of ultra-small LED devices have a first end in contact with the first mounting electrode and a second end in contact with the second mounting electrode; and
a luminance gain according to Equation 2 is 1.1 or more: wherein the Equation 2 is shown as below:

$$\text{Luminance Gain} = \frac{\text{Luminance of ultra-small } LED \text{ electrode assembly driven by DC voltage (cd/m}^2)}{\text{Luminance of ultra-small } LED \text{ electrode assembly driven by AC voltage (cd/m}^2)}$$

wherein, a magnitude of an applied direct current voltage V is equal to a magnitude of an effective voltage of sine wave alternating current power.

2. The full-color light emitting diode display of claim 1, wherein the ultra-small LED electrode assembly has a luminance gain of 1.3 or more according to the Equation 2.

3. The full-color light emitting diode display of claim 1, wherein the light color is blue or white, or the light color is the same as a color of an ultraviolet light.

4. The full-color light emitting diode display of claim 1, further comprising an insulating film formed on outer surfaces of the first mounting electrode and the second mounting electrode,
wherein the plurality of ultra-small LED devices come into contact with the first mounting electrode and the second mounting electrode through the insulating film.

5. A full-color light emitting diode display having an improved luminance, comprising a plurality of subpixels, each of the plurality of subpixels comprises at least one ultra-small LED electrode assembly configured to emit light having substantially the same light color, wherein
the light color is divided into a plurality of different light color groups including a first light color, a second light color, and a third light color;
the ultra-small LED electrode assembly comprises:
a mounting electrode line including a first mounting electrode and a second mounting electrode, wherein the first mounting electrode and the second mounting electrode are formed on the same plane and spaced apart from each other; and
a plurality of ultra-small LED devices, wherein each of the plurality of ultra-small LED devices has a first end in contact with the first mounting electrode and a second end in contact with the second mounting electrode; and
a luminance gain according to Equation 2 is 1.1 or more: wherein the Equation 2 is shown as below:

$$\text{Luminance Gain} = \frac{\text{Luminance of ultra-small } LED \text{ electrode assembly driven by DC voltage (cd/m}^2)}{\text{Luminance of ultra-small } LED \text{ electrode assembly driven by AC voltage (cd/m}^2)}$$

wherein a magnitude of an applied direct current voltage V is equal to a magnitude of an effective voltage (Vrms) of sine wave alternating current power.

6. The full-color light emitting diode display of claim 5, wherein among the plurality of light color groups, the first light color is blue, the second light color is green, and the third light color is red.

7. The full-color light emitting diode display of claim 6, wherein the plurality of light color groups further comprises a fourth light color group; wherein a light color of the fourth light color group is white.

8. The full-color light emitting diode display of claim 5, wherein the ultra-small LED electrode assembly has a luminance gain of 1.3 or more according to the Equation 2.

9. The full-color light emitting diode display of claim 5, further comprising an insulating film formed on outer surfaces of the first mounting electrode and the second mounting electrode,
wherein the plurality of ultra-small LED devices come into contact with the first mounting electrode and the second mounting electrode through the insulating film.

* * * * *